United States Patent
Konno et al.

(10) Patent No.: US 7,692,203 B2
(45) Date of Patent: Apr. 6, 2010

(54) SEMICONDUCTOR LIGHT EMITTING DEVICE

(75) Inventors: Taichiroo Konno, Hitachi (JP); Kazuyuki Iizuka, Hitachi (JP); Masahiro Arai, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 120 days.

(21) Appl. No.: 11/907,976

(22) Filed: Oct. 19, 2007

(65) Prior Publication Data

US 2008/0093612 A1    Apr. 24, 2008

(30) Foreign Application Priority Data

Oct. 20, 2006  (JP) .............................. 2006-286484
Oct. 20, 2006  (JP) .............................. 2006-286485

(51) Int. Cl.
    *H01L 33/00*    (2010.01)
(52) U.S. Cl. ............................ 257/96; 257/79; 257/94; 257/97; 257/98; 257/E33.001

(58) Field of Classification Search ................ 257/96, 257/79, 94, 97, 98, E33.001
See application file for complete search history.

(56) References Cited

U.S. PATENT DOCUMENTS

2005/0079641 A1 * 4/2005 Liu et al. .................... 438/22

FOREIGN PATENT DOCUMENTS

| JP | 2002-217450 | 8/2002 |
| JP | 2002353501 A * | 12/2002 |
| JP | 2004-356279 | 12/2004 |

* cited by examiner

*Primary Examiner*—Lynne A. Gurley
*Assistant Examiner*—Junghwa M Im
(74) *Attorney, Agent, or Firm*—McGinn IP Law Group, PLLC

(57) ABSTRACT

A plurality of semiconductor layers including an active layer 6 and a light extract layer 4, and a reflective metal film 11 are formed in a semiconductor light emitting device. The light extract layer 4 is formed of a plurality of layers 23, 24 having different composition ratios. An irregularity 22 is formed on the layers 23, 24 including an outermost layer to provide a main surface S as a rough-surface.

19 Claims, 11 Drawing Sheets

SEMICONDUCTOR LIGHT EMITTING DEVICE

The present application is based on Japanese Patent Application No. 2006-286484 filed on Oct. 20, 2006 and Japanese Patent Application No. 2006-286485 filed on Oct. 20, 2006, the entire contents of which are incorporated herein by reference.

BACKGROUND OF THE INVENTION

1. Field of the Invention

The present invention relates to a semiconductor light emitting device provided with a rough surface such that a film thickness of a light extract layer is not reduced.

2. Related Art

As to a light emitting diode (LED) which is a semiconductor light emitting device, it is possible to fabricate a high luminance LED emitting various color lights such as blue, green, orange, yellow, and red, since it is possible to grow a GaN based high quality crystal or an AlGaInP based high quality crystal by using MOVPE (Metal Organic Vapor Phase Epitaxy) method in recent years. In accordance with the provision of a high luminance LED, applications of the LED are widened, e.g. a back light of a liquid crystal display, a brake lump for a vehicle, so that demand for the LED increases year by year.

Since the growth of a high quality crystal by using the MOVPE method has been achieved, a light emitting efficiency inside the light emitting device is nearing to a theoretical limit value. However, the light extract efficiency from the light emitting device to the outside is still low, and enhancement of the light extract efficiency is expected.

For example, a high luminance red LED is made from AlGaInP based materials, and has a double hetero structure comprising a conductive GaAs substrate, an n-type AlGaInP layer comprising an AlGaInP based material with a composition which is lattice-matched with the conductive GaAs substrate, a p-type AlGaInP layer, and an active layer which is a part of a light emitting part comprising AlGaInP or GaInP, in which the active layer is sandwiched by the n-type AlGaInP layer and the p-type AlGaInP layer. The AlGaInP based material here is a general term of various kinds of materials mainly comprising AlGaInP, in that composition ratios or additives are different from each other. In the semiconductor light emitting device using the AlGaInP based material, materials such as GaInP, and GaP may be used together.

Since a bandgap of the GaAs substrate is narrower than that of the active layer in such a semiconductor light emitting device, most of the light emitted from the active layer is absorbed by the GaAs substrate, so that the light extract efficiency is deteriorated.

As means for solving this problem, there is a technique for improving the light extract efficiency by forming a layer with a multilayer reflective film structure comprising semiconductors having different refractive indices between the active layer and the GaAs substrate, to reflect the light emitted to the GaAs substrate, thereby reducing absorption of the light in the GaAs substrate. However, according to this technique, only the light having a limited incident angle with respect to the multilayer reflective film structure layer is reflected. In other words, only a part of the light emitted to the GaAs substrate is reflected, so that it is difficult to improve the light extract efficiency enough.

Thus, Japanese Patent Laid-Open No. 2002-217450 discloses another technique for realizing a high luminance by forming a semiconductor light emitting device in which a double hetero structure part comprising AlGaInP based material is grown on a GaAs substrate for growth, sticking the double hetero structure part on a supporting substrate comprising Si, GaAs or the like via a metal layer with a high reflectance, and removing the GaAs substrate used for the growth. According to this technique, since the metal is used as a reflective layer, the reflection with high reflectance can be realized without selecting an incident angle with respect to the reflective layer. For this reason, it is possible to provide a higher luminance than the aforementioned technique in which the multilayer reflective film structure is formed. In other words, it is possible to achieve the higher luminance by extracting the light generated in the active layer more effectively.

FIG. 11 is a schematic cross sectional view showing a structure of a conventional semiconductor light emitting device.

As shown in FIG. 11, a conventional semiconductor light emitting device 101 comprises, in an order from up to bottom, a first electrode 102 for partially covering a light extract layer, a first electrode side contact layer 103 provided only just beneath the first electrode 102 and covering a part of the light extract layer covered by the first electrode 102, the first electrode side contact layer 103 having a bandgap energy smaller than that of the active layer and being opaque with respect to the light emitted from the active layer, a light extract layer 104 constituting a main surface at a first cladding layer side and radiating the light advancing from the active layer to the first cladding layer side, a first cladding layer 105 that is one of two cladding layers sandwiching the active layer, an active layer 106 sandwiched by the first and second cladding layers and generating the light, a second cladding layer 107 that is another one of the two cladding layers, an interposed layer 108 interposed between the second cladding layer 107 and a reflective metal film side contact layer, a reflective metal film side contact layer 109, an oxide layer 110, a reflective metal film 111 provided between the second cladding layer 107 and a second electrode and reflecting the light advanced from the active layer 106 to a second electrode side, a metal adhesion layer 112, a supporting substrate 113 on which the double hetero structure part is stuck, and a second electrode 114 for covering an opposite surface with respect to the main surface.

The light extract layer 104 is also called as a window layer.

The oxide layer 110 comprises ohmic contact portions 115 dispersed appropriately in a plane contacting to the reflective metal film 111, in which parts other than the ohmic contact portions 115 are referred as non-ohmic contact portions 116.

The reflective metal film side contact layer 109 comprises three layers 111, 118 and 119 each of which comprises a material doped with different dopants. In these three layers, an interposed layer side contact layer 117 contacting to the interposed layer 108 comprises a material doped with Mg, an oxide layer side contact layer 119 contacting to the oxide layer 110 comprises a material doped with Zn, and an intermediate contact layer 118 provided between the interposed layer side contact layer 117 and the oxide layer side contact layer 119 comprises a material which is not positively doped.

The layers from the first electrode side contact layer 103 to the reflective metal film side contact layer 109 are referred as a double hetero structure part 120. In addition, the first cladding layer 105, the active layer 106, and the second cladding layer 107 may be totally referred as a light emitting layer 121.

In the semiconductor light emitting device 101 in FIG. 11, the light is not extracted from the main surface (opposite surface) where the supporting substrate 112 is provided, and the light is only extracted from another main surface formed on the light extract layer 104, by providing the reflective metal film 111.

The reflective metal film 111 disposed between the double hetero structure part 120 and the supporting substrate 112 has naturally a high reflectance with respect to the light emitted from the active layer 106, and is required to have an ohmic-contact to the double hetero structure part 120 mainly comprising AlGaInP based material. However, it is difficult to provide a direct ohmic-contact to the AlGaInP based material by using a metal such as Ag, Al, and Au that has a high reflectance at a wavelength of the light emitted from the active layer 106. Therefore, it is necessary to partially provide the ohmic contact portions 115 between the reflective metal film 111 and the double hetero structure part 120. Partial disposition means that the reflective metal film 111 is not totally covered but the ohmic contact portions 115 are disposed appropriately in the plane of the reflective metal film 111.

The ohmic contact portion 115 is disposed between the reflective metal film 111 and the double hetero structure part 120 to take the ohmic contact, in which the reflectance is low as compared with that of the reflective metal film 111. In addition, it is necessary to conduct heat-treatment after providing a material of the ohmic contact portion 115 to contact to the double hetero structure part 120, so as to take the ohmic contact. Alloying reaction occurs between the double hetero structure part 120 and the material of the ohmic contact portion 115 in the occasion of the beat treatment, so that a light absorption rate is increased in the double hetero structure part 120 contacting to the ohmic contact portion 115. For this reason, the light absorption is increased in the ohmic contact portion 115 compared with the non-ohmic contact portion 116, when the light emitted from the active layer 106 passes through the oxide layer 110. As a result, the light extract efficiency of the whole light emitting device is deteriorated.

Even though the reflective metal film 111 has a high reflectance with respect to the light emitted from the active layer 106, if much light cannot be extracted from a surface of the light extract layer 104 which is a main surface, the light extract efficiency will be deteriorated, so that the improvement in the light output will be small. Therefore, as a technique to extract the light effectively, it has been known to make the main surface rough (rough-surface treatment) as disclosed by Japanese Patent Laid-Open No-2004-356279. The rough-surface treatment is to form an irregularity (unevenness) on the surface.

When the light goes out from a substance, there is a constraint of a critical angle. If an angle of the light is perpendicular to a surface, the light can be extracted. However, when there is an inclination, the light cannot be extracted. The critical angle is determined based on a wavelength of the light and a refractive index of the substance. For example, among the light radiated from the light emitting layer 121, the light perpendicular to the light extract layer 104 goes out from the semiconductor light emitting device 101, however, the light having a predetermined angle with respect to the light extract layer 104 cannot go out from the semiconductor light emitting device 101, due to the angle with respect to the main surface. However, when the main surface is formed as a rough surface, the angle of the light having the predetermined angle with respect to the light extract layer 104 is changed with respect to the main surface, so that such a light goes out from the semiconductor light emitting device 101. Therefore, the light extract efficiency can be improved by making the main surface as a rough surface.

As a technique for improving the effect of the rough-surface treatment, there is a technique of forming an irregular pattern by photolithography which is a well-known technique. However, since minute pattern formation is required in this technique, expensive equipment is necessary, and a manufacturing cost of the semiconductor light emitting device is increased as consequence. In addition, the manufacturing cost is increased since the photolithography process is conducted. On the other hand, as a technique for reducing the manufacturing cost, there is a technique for conducting the rough-surface treatment without forming any pattern. However, there is a following disadvantage in this technique.

When the rough-surface treatment is conducted on a surface of the light extract layer which is the main surface, by etching without forming any pattern, the etching totally advances in accordance with the formation of the irregularity, so that a film thickness of the light extract layer is reduced totally. When the film thickness of the light extract layer is reduced totally, a current spreading is deteriorated, a forward voltage is increased, and a light output is decreased simultaneously. As a result, the light emitting efficiency is deteriorated.

The light output is decreased as follows. A calorific value in the semiconductor light emitting device is increased due to the increase in the forward voltage, so that the light emitting efficiency is deteriorated because of the influence of the heat thus generated. In brief, when the film thickness of the light extract layer is reduced, a series resistance is increased as well as the current spreading is deteriorated, so that the forward voltage is increased, thereby reducing the light output.

SUMMARY OF THE INVENTION

Accordingly, so as to solve the above problem, it is an object of the present invention to provide a semiconductor light emitting device, in which a main surface is formed as a rough surface without reducing a film thickness of a light extract layer.

According to a feature of the invention, a semiconductor light emitting device comprises:
  a plurality of semiconductor layers including:
  a first cladding layer,
  a second cladding layer;
  an active layer for generating a light, provided between the first cladding layer and the second cladding layer; and
  a light extract layer constituting a main surface at a side of the first cladding layer;
  a first electrode for partially covering the light extract layer;
  a second electrode for covering a surface opposite to the main surface;
  a reflective metal film for reflecting a light provided between the second cladding layer and the second electrode;
  an oxide layer adjacent to an active layer side of the reflective metal film; and
  an ohmic contact portion in a part of the oxide layer,
  wherein the light extract layer comprises a plurality of layers having different composition ratios and an irregularity is formed on at least an outermost layer in a plurality of the layers to rough the main surface.

According to another feature of the invention, in the semiconductor light emitting device, the irregularity may be formed only on the outermost layer.

In the semiconductor light emitting device, an Al composition ratio of the outermost layer may be greater than that of a layer adjacent to the outermost layer in the layers constituting the light extract layer.

In the semiconductor light emitting device, a bandgap energy of the outermost layer may be greater than that of a layer adjacent to the outermost layer in the layers constituting the light extract layer.

In the semiconductor light emitting device, a material of each of the layers constituting the light extract layer may be expressed as $(Al_{X1}Ga_{1-X1})_{Y1}In_{1-Y1}P$ ($0.3 \leq X1 \leq 1$, $0.4 \leq Y1 \leq 0.6$).

In the semiconductor light emitting device, it is preferable that a total film thickness of the light extract layer and a film thickness of the first cladding layer is from 1000 nm to 3000 nm.

In the semiconductor light emitting device according to claim 2, wherein a refractive index of the outermost layer in the plurality of the layers constituting the light extract layer is greater than that of a layer next to the outermost layer in the plurality of the layers constituting the light extract layer.

The semiconductor light emitting device may further comprise:

a first electrode side contact layer covering a part covered by the first electrode, provided between the light extract layer and the first electrode, having a bandgap energy smaller than that of the active layer, and being opaque with respect to the light emitted from the active layer.

In the semiconductor light emitting device, it is preferable that a film thickness of the outermost layer of the layers constituting the light extract layer is not more than 1000 nm.

The semiconductor light emitting device may further comprise:

a reflective metal film side contact layer provided between the oxide layer and the second cladding layer, and mainly comprising a GaP.

The semiconductor light emitting device may further comprise:

an interposed layer provided between the reflective metal film side contact layer and the second cladding layer, and comprising $Ga_{X2}In_{1-X2}P$ ($0.6 \leq X2 \leq 1$).

In the semiconductor light emitting device, the reflective metal film side contact layer may comprise first, second and third layers, the first layer adjacent to the interposed layer is doped with Mg, the third layer adjacent to the oxide layer is doped with Zn, and the second layer provided between the first and third layers is not positively doped.

In the semiconductor light emitting device, it is preferable that a film thickness $d_1$ of a non-ohmic contact portion in the oxide layer is within a range of ±30% of a standard film thickness dst that is expressed as:

$$dst = \alpha \times \lambda p / 4 \times n$$

(dst is the standard film thickness, $\alpha$ is a constant of an odd number, $\lambda p$ is a wavelength of the light emitted from the active layer, and n is a refractive index of the light emitted from the active layer in the non-ohmic contact portion), and wherein a film thickness $d_2$ of an ohmic contact portion in the oxide layer is equal to the film thickness $d_1$.

The semiconductor light emitting device may further comprise:

an insertion layer inserted into the first cladding layer, the insertion layer comprising a material having a smaller Al composition ratio and a greater refractive index than those of a material of the first cladding layer;

wherein a film thickness of the first cladding layer is not less than 1000 nm, and the first cladding layer functions as a light extract layer.

According to a still another feature of the invention, in the semiconductor light emitting device, the irregularity may be formed over a plurality of the layers to rough the main surface.

In this semiconductor light emitting device, an inclination of an irregular surface of an outermost layer may be smaller than that of a layer adjacent to the outermost layer in the layers constituting the light extract layer.

In this semiconductor light emitting device, an Al composition ratio of an outermost layer may be smaller than that of a layer adjacent to the outermost layer in the layers constituting the light extract layer.

In this semiconductor light emitting device, a bandgap energy of an outermost layer may be smaller than that of a layer adjacent to the outermost layer in the layers constituting the light extract layer.

In this semiconductor light emitting device, it is preferable that a total film thickness of the light extract layer and the first cladding layer is from 800 nm to 5500 nm.

In this semiconductor light emitting device, a refractive index of a material of the light extract layer may be greater than that of the first cladding layer.

In this semiconductor light emitting device, it is preferable that a film thickness of an outermost layer of the layers constituting the light extract layer is from 50 nm to 1000 nm.

According to the present invention, a following superior effect can be obtained.

Namely, the film thickness of the light extract layer is not reduced.

BRIEF DESCRIPTION OF THE DRAWINGS

The present invention will be explained in more detail in conjunction with appended drawings, wherein:

FIGS. 9A and 9B are diagrams showing a semiconductor light emitting device in a ninth preferred embodiment according to the present invention, in which FIG. 9A is a schematic cross sectional view showing a structure of a semiconductor light emitting device in the second preferred embodiment, and FIG. 9B is an enlarged cross sectional view of a light extract layer;

DETAILED DESCRIPTION OF THE PREFERRED EMBODIMENTS

Next, the preferred embodiments according to the present invention will be explained in more detail in conjunction with the appended drawings.

Figure 1:
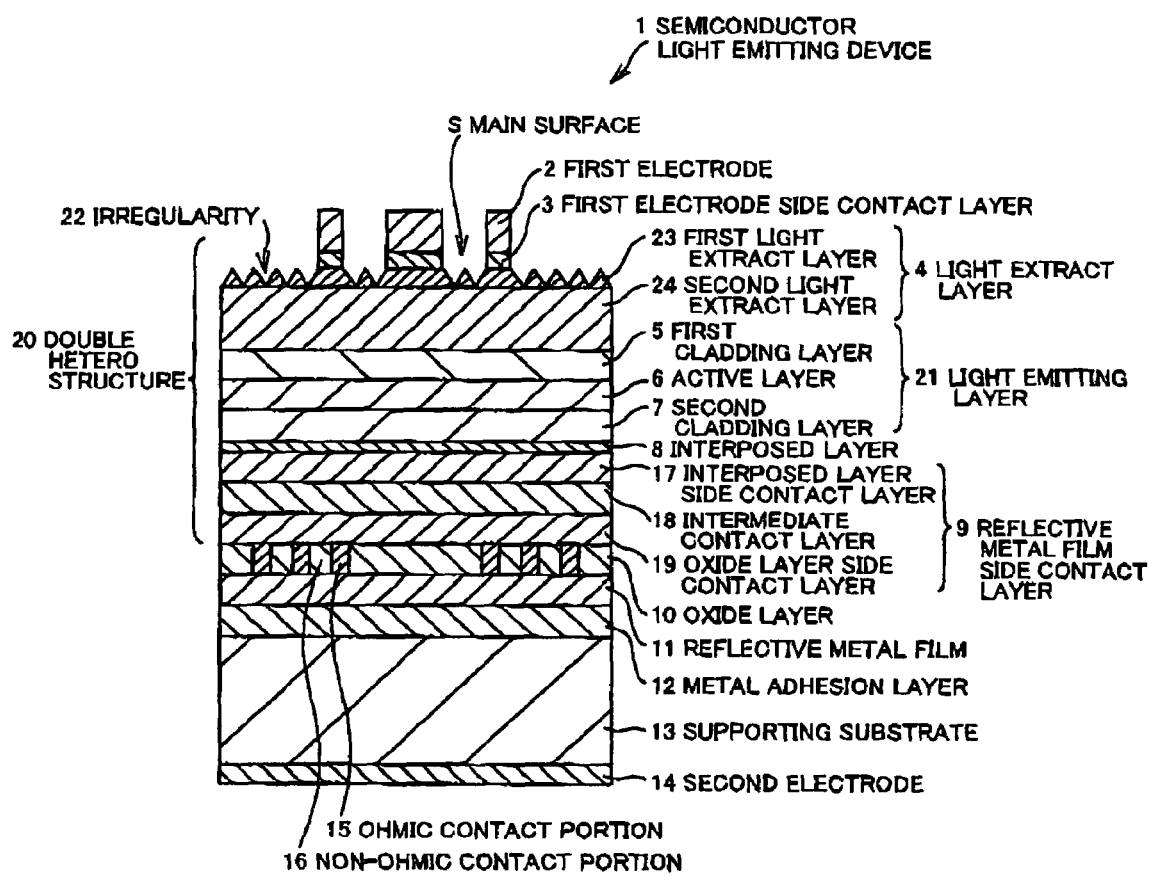
FIG. 1 is a schematic cross sectional view showing a structure of a semiconductor light emitting device in a first preferred embodiment according to the present invention.

FIG. 1 is a schematic cross sectional view showing a structure of a semiconductor light emitting device in a first preferred embodiment according to the present invention.

As shown in FIG. 1, a semiconductor light emitting device 1 in the first preferred embodiment according to the invention comprises, a first electrode 2 for partially covering a light extract layer, a first electrode side contact layer 3 provided only just beneath the first electrode 2 and covering a part of the light extract layer covered by the first electrode 2, the first electrode side contact layer 3 having a bandgap energy smaller than that of the active layer and being opaque with respect to the light emitted from the active layer, a light extract layer 4 constituting a main surface at a first cladding layer side and radiating the light advancing from the active layer to the first cladding layer side, a first cladding layer 5 that is one of two cladding layers sandwiching the active layer, an active layer 6 sandwiched by the first and second cladding layers and generating the light, a second cladding layer 7 that is another one of the two cladding layers, an interposed layer 8 interposed between the second cladding layer 7 and a reflective metal film side contact layer, and a reflective metal film side contact layer 9, an oxide layer 10, a reflective metal film 11 provided between the second cladding layer 7 and a second electrode and reflecting the light advanced from the active layer 6 to a second electrode side, a metal adhesion layer 12, a supporting substrate 13 on which a double hetero structure part is stuck, and a second electrode 14 for covering an opposite surface with respect to the main surface.

The light extract layer 4 is also called as a window layer.

The oxide layer 10 comprises ohmic contact portions 15 dispersed appropriately in a plane contacting to the reflective metal film 11, in which parts other than the ohmic contact portions 15 are referred as non-ohmic contact portions 16.

It is preferable that a proportion of an area of the ohmic contact portion 15 to a total area of the oxide layer 10 is not more than 20%.

Further, it is preferable that a film thickness $d_1$, of a non-ohmic contact portion 16 in the oxide layer 10 is within a range of ±30% of a standard film thickness dst that is expressed as:

$$dst = \alpha \times \lambda p / 4 \times n$$

(dst is the standard film thickness, α is a constant of an odd number, λp is a wavelength of the light emitted from the active layer, and n is a refractive index of the light emitted from the active layer in the non-ohmic contact portion), and wherein a film thickness $d_2$ of the ohmic contact portion 15 in the oxide layer 10 is equal to the film thickness $d_1$.

The reflective metal film side contact layer 9 comprises three layers 17, 18 and 19 each of which comprises a material doped with different dopants. In these three layers, an interposed layer side contact layer 17 contacting to the interposed layer 8 comprises a material doped with Mg, an oxide layer side contact layer 19 contacting to the oxide layer 10 comprises a material doped with Zn, and an intermediate contact layer 18 provided between the interposed layer side contact layer 17 and the oxide layer side contact layer 19 comprises a material which is not positively doped.

The layers from the first electrode side contact layer 3 to the reflective metal film side contact layer 9 are referred as a double hetero structure part 20. In addition, the first cladding layer 5, the active layer 6, and the second cladding layer 7 may be totally referred as a light emitting layer 21.

The semiconductor light emitting device 1 according to this preferred embodiment is characterized by the light extract layer 4. Namely, the light extract layer 4 comprises a plurality of layers having different composition ratios, and an irregularity 22 is formed over a plurality of the layers to make a main surface S as a rough surface. In this preferred embodiment, the light extract layer 4 comprises two layers in which an outermost layer is a first light extract layer 23, and a layer adjacent to the outermost layer is a second light extract layer 24.

As shown in FIG. 1, the irregularity 22 is formed only at the first light extract layer 23, and not formed at the second light extract layer 24. In the conventional device, since only one kind of the light extract layer 104 is provided, the film thickness will be totally reduced if the etching is conducted. In this preferred embodiment, the second light extract layer 24 having an Al composition ratio smaller than that of the first light extract layer 23 is provided beneath the first light extract layer 23, so that there is a difference in the etching rates of the first light extract layer 23 and the second light extract layer 24. Accordingly, it is possible to prevent that the light extract layer 4 from being totally etched. The etching rate is partially different in accordance with the crystallinity. Therefore, when the etching achieves to the second light extract layer 24 provided beneath the uppermost layer due to the high etching rate in a certain region, the etching rate is slow down, since the second light extract layer 24 has the Al composition ratio smaller than that of the first light extract layer 23. Therefore, it is possible to conduct the etching uniformly, thereby preventing the film thickness from being totally reduced.

Further, while it is not illustrated in FIG. 1, the Al composition ratio of the first light extract layer 23 is greater than that of the second light extract layer 24, and a bandgap energy of the first light extract layer 23 is greater than that of the second light extract layer 24.

In this preferred embodiment, a rough-surface treatment is conducted on the light extract layer 4 by the etching without forming any pattern. At this time, it is possible to suppress that the film thickness of the light extract layer 4 is totally reduced, by providing the light extract layer 4 to have a multilayer structure comprising a plurality of layers having different composition ratios.

In other words, since the etching rate is increased at a part where crystallinity is inferior to other parts, the etching is advanced in the part with the inferior crystallinity compared with the other parts. In this preferred embodiment, even if the crystallinity of the first light extract layer 23 is inferior to the second light extract layer 24, since the etching rate of the second light extract layer 24 located beneath the first light extract layer 23 is low, the etching is stopped (slow down). As a result, it is possible to suppress that the film thickness of the light extract layer 4 is totally reduced.

In the semiconductor light emitting device 1 according to this preferred embodiment, the increase in the forward voltage can be prevented, since the film thickness of the light extract layer 4 is not reduced. By suppressing the increase in the forward voltage, generation of heat in the semiconductor light emitting device 1 can be suppressed. As a result, the light output can be improved. Further, since the film thickness of the light extract layer 4 is not reduced, the current flown through the active layer 6 can be uniformed. Further, the generation of the heat in the semiconductor light emitting device 1 can be suppressed by making the current uniform. Still further, since the current spreading property is improved, the light extract loss due to a shadow of the first electrode 2 can be suppressed, thereby improving the light output. In addition, the overflow of the carrier can be prevented by suppressing the electric current constriction, thereby improving the internal quantum efficiency. As the above factors are overlapped, the light output of the semiconductor light emitting device 1 is improved.

In the semiconductor light emitting device 1 according to this preferred embodiment, the Al composition ratio of the material of the first light extract layer 23 is greater than that of the second light extract layer 24. The etching rate of the material having a greater Al composition ratio is greater than the etching rate of the material having a smaller Al composition ratio. Since the second light extract layer 24 is located beneath the first light extract layer 23, when an etched part achieves at the second light extract layer 24, the etching rate is slow down.

In the semiconductor light emitting device 1 according to this preferred embodiment, the bandgap energy of the first light extract layer 23 is greater than that of the second light extract layer 24. It is because that the Al composition ratio of the material of the first light extract layer 23 is greater than that of the second light extract layer 24.

Next, second to seventh preferred embodiment according to this preferred embodiment will be explained below.

Figure 2:
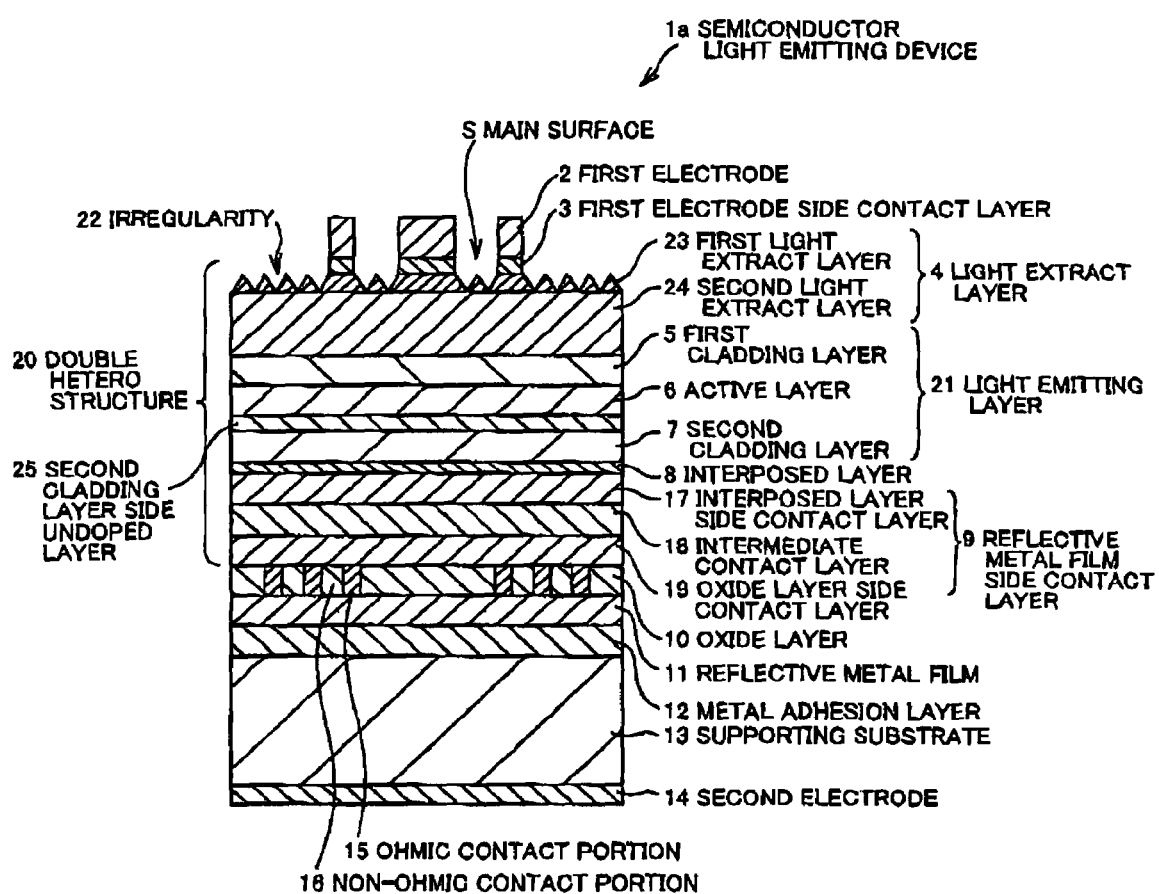
FIG. 2 is a schematic cross sectional view showing a structure of a semiconductor light emitting device in a second preferred embodiment according to the present invention.

FIG. 2 is a schematic cross sectional view showing a structure of a semiconductor light emitting device in a second preferred embodiment according to the present invention.

A semiconductor light emitting device 1a shown in FIG. 2 is similar to the semiconductor light emitting device 1 shown in FIG. 1 except the structure of the light emitting layer 21. In the semiconductor light emitting device 1a, a second cladding layer side undoped layer 25 is provided between the active layer 6 and the second cladding layer 7. In this case, the light extract layer 4 has the same structure as that in the semiconductor light emitting device 1 shown in FIG. 1, the effect of preventing the reduction in the film thickness of the light extract layer 4 can be obtained.

Figure 3:
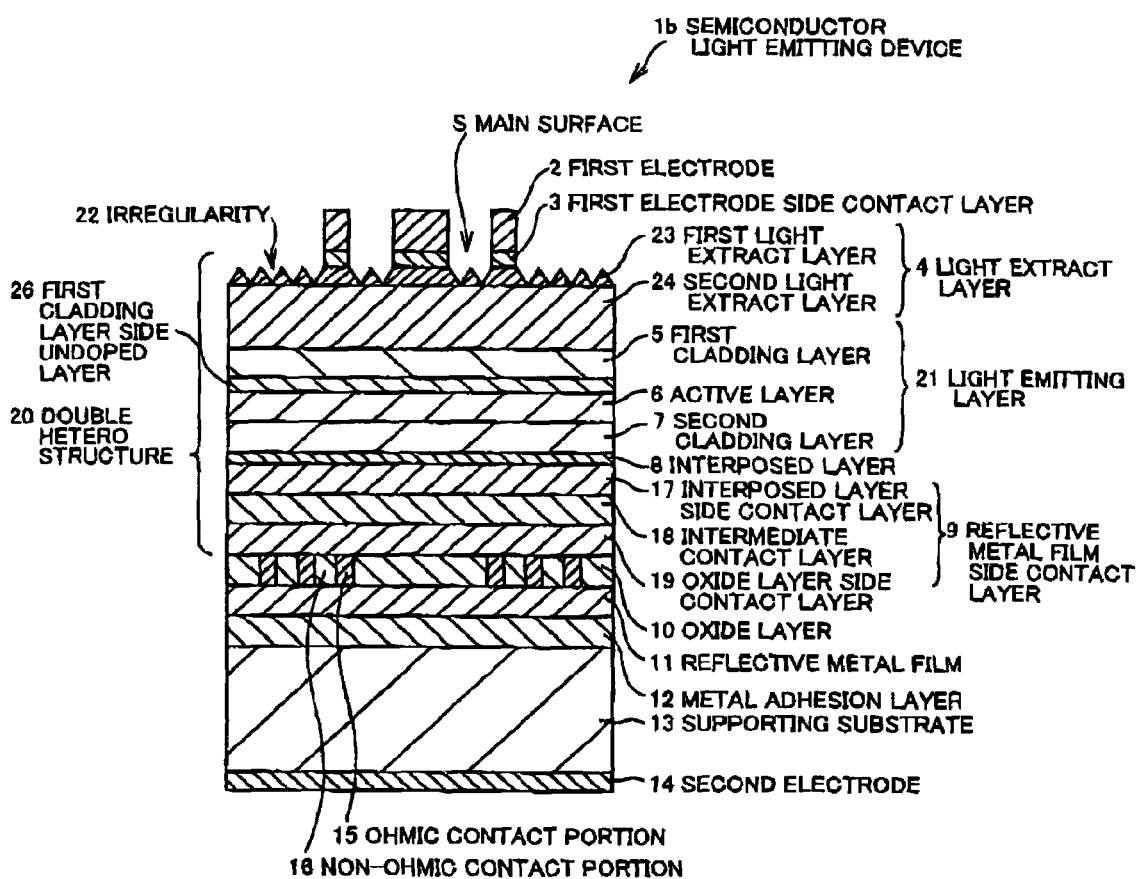
FIG. 3 is a schematic cross sectional view showing a structure of a semiconductor light emitting device in a third preferred embodiment according to the present invention.

FIG. 3 is a schematic cross sectional view showing a structure of a semiconductor light emitting device in a third preferred embodiment according to the present invention.

A semiconductor light emitting device 1b shown in FIG. 3 is similar to the semiconductor light emitting device 1 shown in FIG. 1 except the structure of the light emitting layer 21. In the semiconductor light emitting device 1b, a first cladding layer side undoped layer 26 is provided between the active layer 6 and the first cladding layer 5. In this case, the effect of preventing the reduction in the film thickness of the light extract layer 4 can be obtained.

Figure 4:
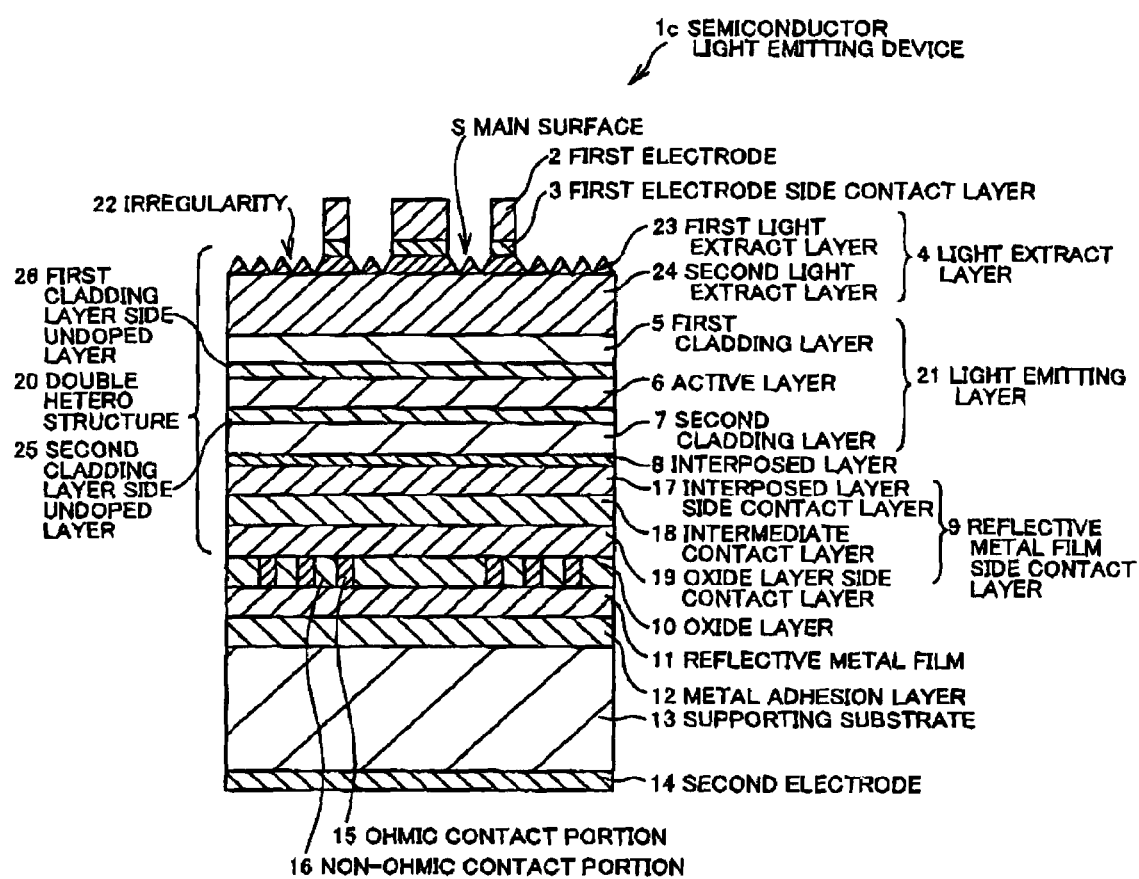
FIG. 4 is a schematic cross sectional view showing a structure of a semiconductor light emitting device in a fourth preferred embodiment according to the present invention.

FIG. 4 is a schematic cross sectional view showing a structure of a semiconductor light emitting device in a fourth preferred embodiment according to the present invention.

A semiconductor light emitting device 1c shown in FIG. 4 is similar to the semiconductor light emitting device 1 shown in FIG. 1 except the structure of the light emitting layer 21. In the semiconductor light emitting device 1c, a second cladding layer side undoped layer 25 is provided between the active layer 6 and the second cladding layer 7 and a first cladding layer side undoped layer 26 is provided between the active layer 6 and the fist cladding layer 5. In this case, the effect of preventing the reduction in the film thickness of the light extract layer 4 can be obtained.

Figure 5:
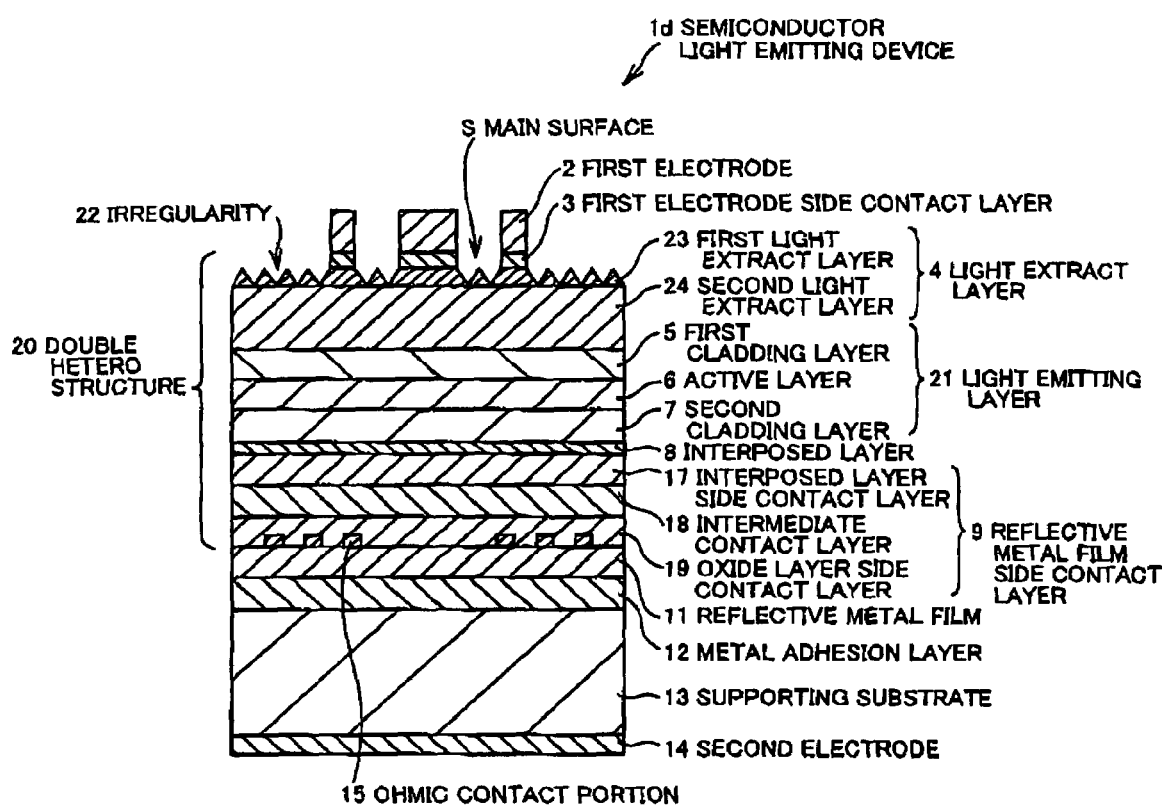
FIG. 5 is a schematic cross sectional view showing a structure of a semiconductor light emitting device in a fifth preferred embodiment according to the present invention.

FIG. 5 is a schematic cross sectional view showing a structure of a semiconductor light emitting device in a fifth preferred embodiment according to the present invention.

A semiconductor light emitting device 1d shown in FIG. 5 is similar to the semiconductor light emitting device 1 shown in FIG. 1 except an electrical bonding structure between the double hetero structure part 20 and the reflective metal film 11. In the semiconductor light emitting device 1d, the oxide layer 10 is not provided, and an ohmic contact portion 15 is formed in the oxide layer side contact layer 19. In this case, the effect of preventing the reduction in the film thickness of the light extract layer 4 can be obtained.

Figure 6:
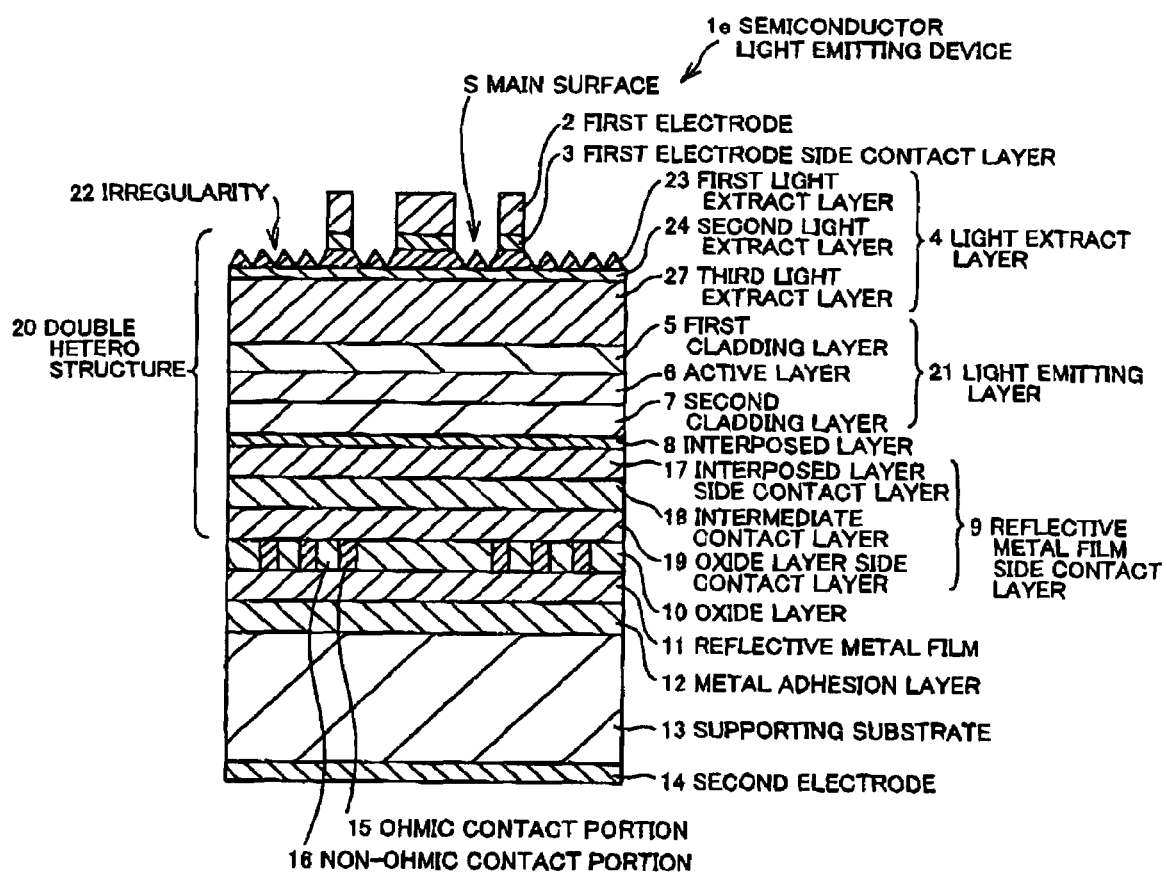
FIG. 6 is a schematic cross sectional view showing a structure of a semiconductor light emitting device in a sixth preferred embodiment according to the present invention.

FIG. 6 is a schematic cross sectional view showing a structure of a semiconductor light emitting device in a sixth preferred embodiment according to the present invention.

A semiconductor light emitting device 1e shown in FIG. 6 is similar to the semiconductor light emitting device 1 shown in FIG. 1 except the light extract layer 4. In the semiconductor light emitting device 1e, the light extract layer 4 has a triple layer structure comprising a first light extract layer 23, a second light extract layer 24, and a third light extract layer 27, in which the first light extract layer 23 and the third light extract layer 27 have the same composition. This structure corresponds to a structure in that the second light extract layer 24 is inserted into the single light extract layer 4. In this case, the effect of preventing the reduction in the film thickness of the light extract layer 4 can be obtained.

Figure 7:
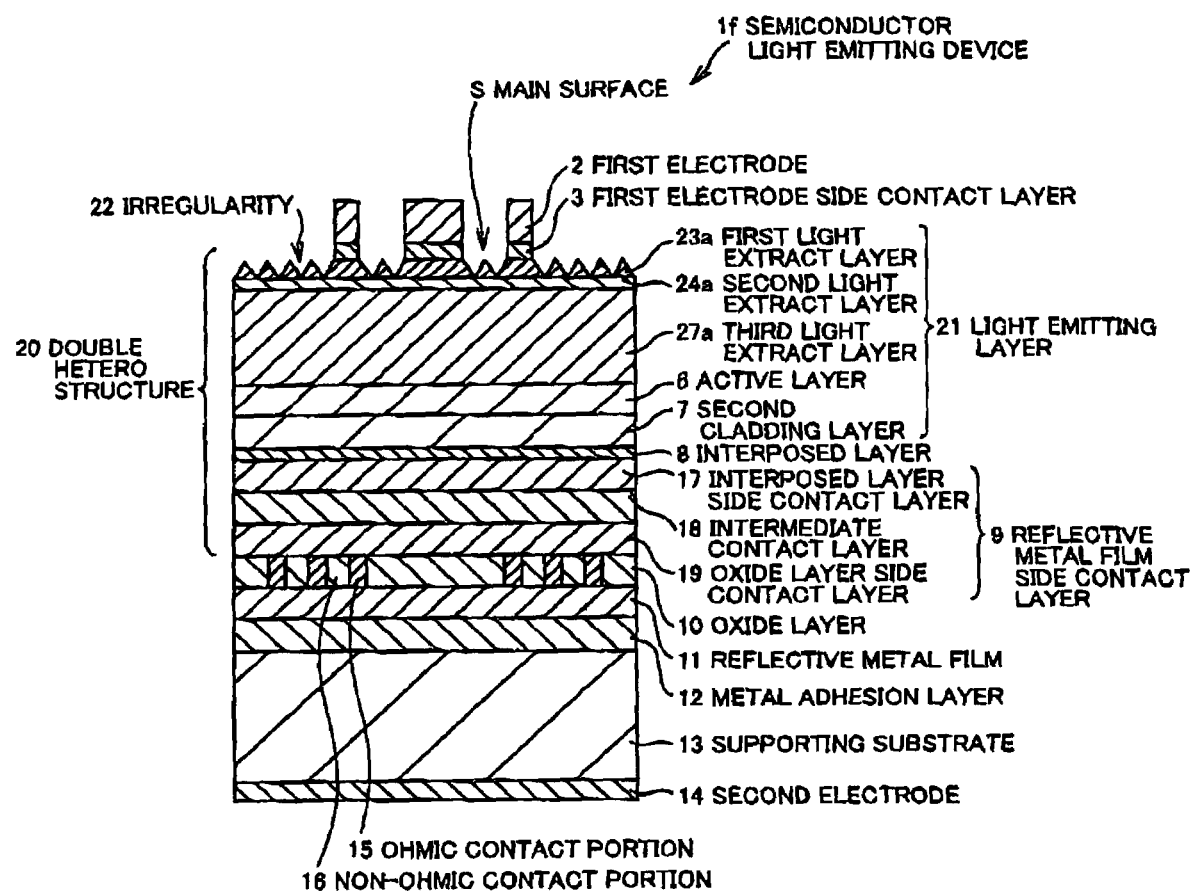
FIG. 7 is a schematic cross sectional view showing a structure of a semiconductor light emitting device in a seventh preferred embodiment according to the present invention.

FIG. 7 is a schematic cross sectional view showing a structure of a semiconductor light emitting device in a seventh preferred embodiment according to the present invention.

A semiconductor light emitting device 1f shown in FIG. 7 is similar to the semiconductor light emitting device 1 shown in FIG. 1 except the structures of the light extract layer 4 and the light emitting layer 21. In the semiconductor light emitting device 1f, the light extract layer 4 is not specially provided. A thickness of a layer corresponding to the first cladding layer 5 of the light emitting 21 in the semiconductor light emitting device 1 shown in FIG. 1 is increased to have a film thickness of not less than 1000 nm, so that this layer functions as a cladding layer as well as a light extract layer. Then, an insertion layer is inserted into the layer corresponding to the first cladding layer 5. The insertion layer is referred as a second light extract layer 24a. A layer provided at an outer side of the second light extract layer 24a is referred as a first light extract layer 23a, and the rough-surface treatment is conducted thereon. A layer provided at an inner side of the second light extract layer 24a is referred as a third light extract layer 27a.

A material of the second light extract layer 24a is preferably expressed as $(Al_X Ga_{1-X})_Y In_{1-Y} P$ ($0.3 \leq X \leq 1$, $0.4 \leq Y \leq 0.6$). A film thickness of the second light extract layer 24a is preferably from 5 nm to 500 nm.

Preferable numerical value ranges in the first to seventh preferred embodiments and other preferred embodiments will be explained below.

For example, a film thickness of the first light extract layer 23 of the semiconductor light emitting device 1 is not more than 1000 nm. This is because that when the film thickness of the first light extract layer 23 is too thick, the manufacturing cost will be increased. On the other hand, when the film thickness of the first light extract layer 23 is too thin, the rough-surface effect cannot be obtained enough, so that the light output is not increased. Therefore, the film thickness of the first light extract layer 23 is preferably from 30 nm to 1000 nm, and more preferably from 50 nm to 800 nm.

A total film thickness of the light extract layers 4, 4a and the first cladding layer 5 is preferably from 1000 nm to 3000 nm. The reason therefor is as follows. The first cladding layer 5 functions as a carrier supplying layer and a barrier layer for stopping a hole as well as a light extract layer (window layer). The characteristics of the LED can be improved by increasing this total film thickness, however, when the total film thickness exceeds 3000 nm, the manufacturing cost is increased.

A film thickness of the first electrode side contact layer 3 is preferably from 5 nm to 200 nm. The reason therefor is as follows. When this film thickness is too thin, the function as a contact layer is insufficient. On the other hand, when the film thickness is too thick, the electric current is hard to be flown, and a direct current resistance is increased and the forward voltage is increased. Therefore, the film thickness is preferably from 5 nm to 200 nm, and more preferably from 10 nm to 100 nm.

A composition of a material of the interposed layer 8 is preferably $Ga_xIn_{1-x}P$ ($0.6 \leq X < 1$). It is because that the emitted light is absorbed when X is smaller than 0.6.

A dopant to be doped to a material of the oxide layer side contact layer 19 contacting to the oxide layer 10 in the reflective metal film side contact layer 9 is preferably Zn. The reason therefor is as follows. Since Zn can be doped more easily compared with Mg, it is possible to realize a low resistance. The contact resistance can be lowered by increasing the doping amount, thereby reducing the forward voltage.

A dopant to be doped to a material of the interposed layer side contact layer 17 contacting to the interposed layer 8 in the reflective metal film side contact layer 9 is preferably Mg. The reason therefor is as follows. Since Mg is hard to be dispersed compared with Zn, deterioration in the initial light output due to the dispersion can be suppressed, and the reliability (relative output) can be improved since it is hard to be dispersed. Herein, the reliability (relative output) is a ratio of the light output after electrification to the initial light output.

The intermediate contact layer 18 to be provided between the interposed layer side contact layer 17 of the reflective metal film side contact layer 9 and the oxide layer side contact layer 19 preferably comprises an undoped material, namely a material which is not positively doped. The reason therefor is as follows. When the Mg-doped layer and the Zn-doped layer are adjacent to each other, mutual dispersion occurs. The mutual dispersion can be prevented by interposing the intermediate contact layer 18.

It is preferable that the active layer 6 comprises 10 to 160 layers namely 5 to 80 pairs of the MQW structures. The reason therefor is as follows. When the number of pairs is too small, the overflow of electrons or holes occurs, thereby deteriorating internal quantum efficiency. On the other hand, when the number of pairs is too large, the deterioration in the light output due to the light absorption in the active layer 6 occurs. The number of pairs is preferably from 5 pairs to 80 pairs, and more preferably from 20 pairs to 60 pairs. In addition, when the active layer 6 comprises a single layer, the film thickness is preferably from 20 nm to 200 nm for the similar reason.

The light emitting wavelength of the semiconductor light emitting devices 1 to 1f is not limited to 630 nm (red). The present invention is still effective, in other LED devices using a AlGaInP based material with a light emitting wavelength from 560 nm to 660 nm, without modifying the material of each layer, the carrier concentration, and the structure of the light extract layers 4

A surface-viewed shape of the first electrode 2 may be circular, rectangular, lozenge, polygonal or heteromorphous.

The material of the supporting substrate 13 may comprise Si, GaAs, Ge, Cu, Mo, W, CuW or the like.

The active layer 6 is not limited to a MQW structure, and may comprise a strained MQW structure or an undoped bulk layer (single layer).

Figure 8:
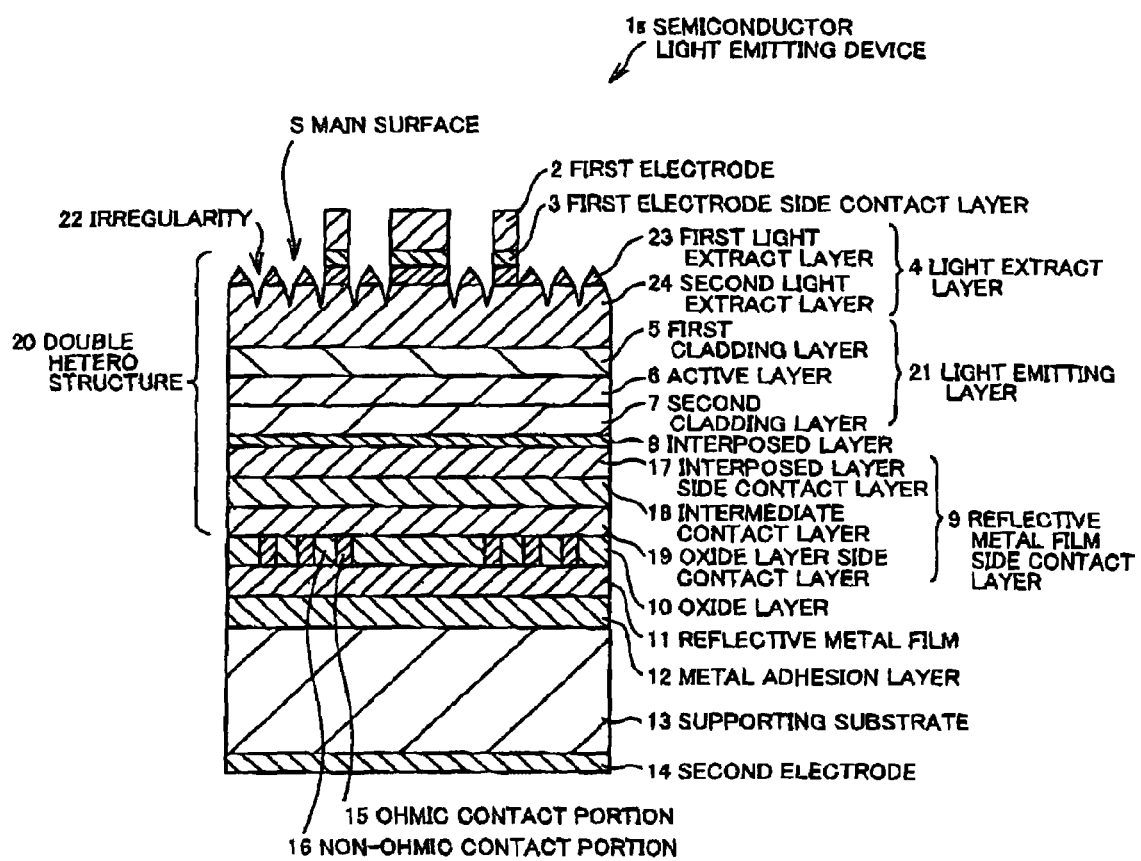
FIG. 8 is a schematic cross sectional view showing a structure of a semiconductor light emitting device in an eighth preferred embodiment according to the present invention.

FIG. 8 is a schematic cross sectional view showing a structure of a semiconductor light emitting device in a eighth preferred embodiment according to the present invention.

As shown in FIG. 8, a semiconductor light emitting device 1g in the eighth preferred embodiment according to the invention comprises, a first electrode 2 for partially covering a light extract layer, a first electrode side contact layer 3 provided only just beneath the first electrode 2 and covering a part of the light extract layer covered by the first electrode 2, the first electrode side contact layer 3 having a bandgap energy smaller than that of the active layer and being opaque with respect to the light emitted from the active layer, a light extract layer 4 constituting a main surface at a first cladding layer side and radiating the light advancing from the active layer to the first cladding layer side, a first cladding layer 5 that is one of two cladding layers sandwiching the active layer, an active layer 6 sandwiched by the first and second cladding layers and generating the light, a second cladding layer 7 that is another one of the two cladding layers, an interposed layer 8 interposed between the second cladding layer 7 and a reflective metal film side contact layer, and a reflective metal film side contact layer 9, an oxide layer 10, a reflective metal film 11 provided between the second cladding layer 7 and a second electrode and reflecting the light advanced from the active layer 6 to a second electrode side, a metal adhesion layer 12, a supporting substrate 13 on which the double hetero structure part is stuck, and a second electrode 14 for covering an opposite surface with respect to the main surface.

The semiconductor light emitting device 1g in the eighth preferred embodiment is different from the semiconductor light emitting device 1 in the first preferred embodiment in that, as shown in FIG. 8, the irregularity 22 is formed over the first light extract layer 23 and the second light extract layer 24. In addition, an inclination of a surface of the irregularity 22 of the first light extract layer 23 is smaller than that of the second light extract layer 24.

The reason why the inclination of the surface of the irregularity 22 of the first light extract layer 23 is smaller than that of the second light extract layer 24 is that an etching rate for the first light extract layer 23 is lower than that for the second light extract layer 24.

When the inclination of the surface of the irregularity 22 is formed to have various angles, the light incident on the light extract layer 4 with various angles can be extracted. Therefore, it is possible to improve the light extract efficiency by providing the inclination of the surface of the irregularity 22 to be different between the first light extract layer 23 and the second light extract layer 24.

Further, the semiconductor light emitting device 1g in the eighth preferred embodiment is different from the semiconductor light emitting device 1 in the first preferred embodiment in that an Al composition ratio of a material of the first light extract layer 23 is smaller than that of the second light extract layer 24, and a bandgap energy of the first light extract layer 23 is smaller than that of the second light extract layer 24.

In this preferred embodiment, a rough-surface treatment is conducted on the light extract layer 4 by the etching without forming any pattern. At this time, etching rate differences between the respective layers can be realized by providing the light extract layer 4 to have a multilayer structure comprising a plurality of layers having different composition ratios. In other words, the etching rate of the second light extract layer 24 having the Al composition ratio greater than that of the first light extract layer 23 is greater than the etching rate of the first light extract layer 23. Accordingly, the first light extract layer 23 is firstly etched so that a concave portion formed at the first light extract layer 23 reaches the second light extract layer 24, then a part of the second light extract layer 24 thus exposed is rapidly etched, so that the concave portion is deepened. On the other hand, a convex portion where the first light extract layer 23 remains is still slowly etched, so that the first light extract layer 23 is left, and a height of the convex portion is relatively increased as consequence. In such a manner, the irregularity 22 having a desired level difference is formed within a relatively short time while a total film thickness of the light extract layer 4 is not reduced, since the respective layers are etched with the different etching rates.

In the semiconductor light emitting device 1g according to this preferred embodiment, the increase in the forward voltage can be prevented as well as the electric current constriction in the light emitting layer 21 can be prevented, since the film thickness of the light extract layer 4 is not reduced. As a result, the deterioration of the light emitting efficiency can be controlled, so that the semiconductor light emitting device 1g with a high light emitting efficiency can be realized in a low cost.

In the semiconductor light emitting device 1g according to this preferred embodiment, the inclination of the surface of the irregularity 22 of the first light extract layer 23 is smaller than that of the second light extract layer 24, so that the angle of the surface of the irregularity 22 is various, thereby improving the light extract efficiency.

In the semiconductor light emitting device 1g according to this preferred embodiment, the bandgap energy of the first light extract layer 23 is smaller than that of the second light extract layer 24. It is effective to change the Al composition to reduce the bandgap energy in the same material. The etching rate using the same etching liquid can be changed by changing the Al composition. It is possible to vary the angle of the surface of the irregularity 22 by changing the etching rate. In other words, the bandgap energy of the first light extract layer 23 is made smaller than that of the second light extract layer 24, in order to vary the angle of the surface of the irregularity 22 by the etching using the same etching liquid.

Next, a ninth preferred embodiment according to the present invention will be explained below.

Figure 9A:
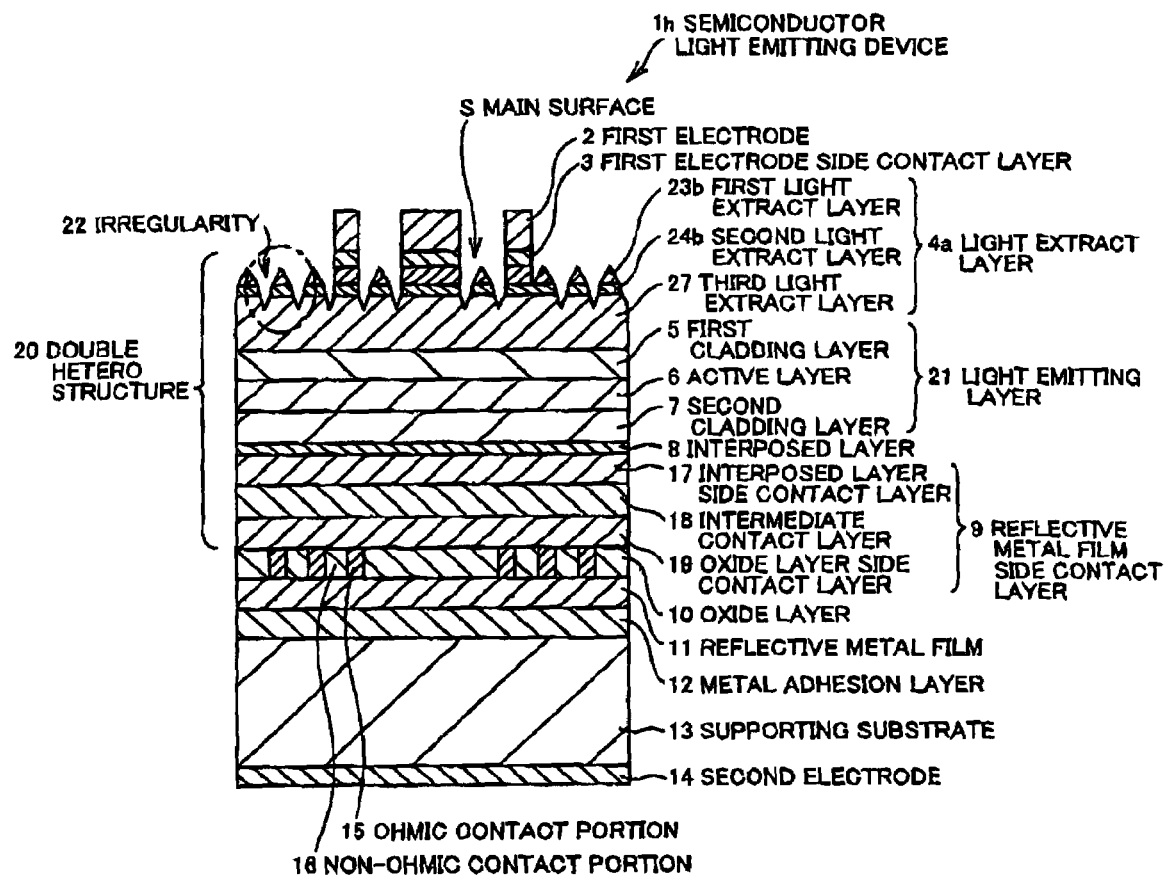
Figure 9B:
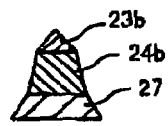

FIGS. 9A and 9B are diagrams showing a semiconductor light emitting device in a ninth preferred embodiment according to the present invention, in which FIG. 9A is a schematic cross sectional view showing a structure of a semiconductor light emitting device in the ninth preferred embodiment, and FIG. 9B is an enlarged cross sectional view of a light extract layer.

A semiconductor light emitting device 1h shown in FIG. 9A is similar to the semiconductor light emitting device 1 shown in FIG. 1 except the structure of the light extract layer 4a. As clearly shown in FIG. 2B, the light extract layer 4a comprises a first light extract layer 23b, a second light extract layer 24b, and a third light extract layer 27. In the respective layers 23b, 24b and 27, the composition ratios, the inclinations of the surface of the irregularity 22, and the bandgap energies are different from each other.

In other words, as for the Al composition ratio, the Al composition ratio in the first light extract layer 23b is equal to that of the third light extract layer 27, and the Al composition ratio of the second light extract layer 24b is greater than those of the first light extract layer 23b and the third light extract layer 27.

As for the inclination of the surface of the irregularity 22, the inclination of the second light extract layer 24b is greater than the inclination of the first light extract layer 23b and the inclination of the third light extract layer 27.

As for the bandgap energy, the bandgap energy of the second light extract layer 24b is greater than the bandgap energy of the first light extract layer 23b and the bandgap energy of the third light extract layer 7.

As described above, three layers namely the first light extract layer 23b, the second light extract layer 24b, and the third light extract layer 27 are provided as the light extract layer 4a, the Al composition ratio of the first light extract layer 23b that is an outermost layer of the light extract layer 4a in the semiconductor light emitting device is equal to the Al composition ratio of the third light extract layer 27 that is an innermost layer of the light extract layer 4a in the semiconductor light emitting device, and the Al composition ratio of the second light extract layer 24b interposed therebetween is greater than those of the first light extract layer 23b and the third light extract layer 27. This structure corresponds to a structure in that a layer comprising a material having the Al composition ratio greater than that of the light extract layer 104 is inserted into the light extract layer 104 of the conventional semiconductor light emitting device 101. A material of the insertion layer is expressed as $(Al_xGa_{1-x})_YIn_{1-Y}P$ ($0.4 < X \leq 1$, $0.4 \leq Y \leq 0.6$).

In this semiconductor light emitting device 1h, the etching rate of the second light extract layer 24b having the Al composition ratio greater than that of the first light extract layer 23b is greater than the etching rate of the first light extract layer 23b. Therefore, similarly to the semiconductor light emitting device 1g shown in FIG. 8, the irregularity 22 having the desired level difference is formed within a short time and the total film thickness of the light extract layer 4 is not reduced since there are etching rate differences between the respective layers.

Next, a tenth preferred embodiment will be explained below. The semiconductor light emitting device 1i in the tenth preferred embodiment is different from the semiconductor light emitting device 1g in the eighth preferred embodiment, except that a second cladding layer side undoped layer 25 is provided. An epitaxial structure of the semiconductor light emitting device 1h in the tenth preferred embodiment according to the present invention is similar to that of the semiconductor light emitting device 1a in the second preferred embodiment shown in FIG. 2. Therefore, the drawing of the semiconductor light emitting device 1i in the tenth preferred embodiment is omitted. In the tenth preferred embodiment, the material of the second cladding layer side undoped layer 25 has an Al composition ratio greater than that of the material of the active layer 6. In addition, the bandgap energy of the material of the second cladding layer side undoped layer 25 is greater than that of the material of active layer 6.

A material of the second cladding layer side undoped layer 25 is expressed as $(Al_xGa_{1-x})_YIn_{1-Y}P$ ($0.3 \leq X \leq 1$, $0.4 \leq Y \leq 0.6$), and a material of the active layer 6 is expressed as $(Al_xGa_{1-x})_YIn_{1-Y}P$ ($0 \leq X \leq 0.5$, $0.4 \leq Y \leq 0.6$).

In the tenth preferred embodiment, the irregularity 22 having the desired level difference can be formed within a relatively short time. In the semiconductor light emitting device in the tenth preferred embodiment, the first light extract layer 23 and the second light extract layer 24 constitutes the light extract layer 4, and the second light extract layer 24 is subjected to a slight etching (not shown).

Preferable numerical value ranges in the eighth to tenth preferred embodiments and other preferred embodiments will be explained below.

For example, a film thickness of the first light extract layer 23 of the semiconductor light emitting device 1g, 1h, 1i and a film thickness of the first light extract layer 23b of the semiconductor light emitting device 1g, 1h, 1i are 400 nm, respectively. This is because that when the film thickness of the first light extract layers 23, 23b is too thin, all the first light extract layers 23, 23b disappear during the etching. In addition, when the film thickness is too thick, the etching time is increased and more material is required, so that a time for the epitaxial growth is increased, thereby increasing the manufacturing cost. In addition, an excessively large film thickness is not effective to increase the light output. Therefore, the film thickness of the first light extract layers 23, 23b is preferably from 50 nm to 1000 nm, and more preferably from 100 nm to 800 nm.

When the film thickness of the light extract layer 4 and the light extract layer 4a is increased, the spreading (dispersion) property is improved, so that the characteristics of the light emitting diode are improved. However, even though the film thickness is further increased, the increase in the effect of spreading the current is saturated. Therefore, when the film thickness is too thick, there is no harmful effect, however, the manufacturing cost is increased. When the film thickness is too thin, the light output is decreased, and the forward voltage is increased. Therefore, the film thickness of the light extract layers 4, 4a is preferably from 500 nm to 5000 nm, and more preferably from 1000 nm to 4000 nm.

The film thickness of the second light extract layer 24b of the semiconductor light emitting device 1h is preferably from 50 nm to 1000 nm. The reason therefore will be explained as follows. The etching rate of the second light extract layer 24b having the Al composition ratio greater than the Al composition ratios of the first and third light extract layers 23b, 27 is greater than the etching rates of the first and third light extract layers 23b, 27. By interposing the second light extract layer 24b between the first light extract layer 23b and the third light extract layer 27, the effect of suppressing the etching dispersion can be obtained. However, when the film thickness of the second light extract layer 24b is too thin, the second light extract layer 24b immediately disappears during the etching so that the effect for suppressing the etching dispersion is deteriorated, and an area of an inclined plane of the second light extract layer 24b is reduced so that the light extracted from the inclined plane is decreased. On the other hand, when the film thickness of the second light extract layer 24b is too thick, the effect for suppressing the etching dispersion cannot be obtained.

A total of the film thickness of the light extract layers 4, 4a and the first cladding layer 5 is preferably from 800 nm to 5500 nm. The reason therefor is as follows. The first cladding layer 5 functions as a carrier supplying layer and a barrier layer for stopping a hole as well as a light extract layer (window layer). The characteristics of the LED can be improved by increasing this total film thickness, however, when the total film thickness exceeds 5500 nm, the manufacturing cost is increased. In addition, it is required that the film thickness of the first cladding layer 5 is not less than 300 nm to have a function of the barrier layer. Since the film thickness of the light extract layers 4, 4a is not less than 500 nm, the total of the film thickness of the light extract layers 4, 4a and the film thickness of the first cladding layer 5 is preferably from 800 nm to 5500 nm.

A film thickness of the first electrode side contact layer 3 is preferably from 5 nm to 200 nm. The reason therefor is as follows. When this film thickness is too thin, the function as a contact layer is insufficient. On the other hand, when the film thickness is too thick, the electric current is hard to be flown, and a direct current resistance is increased and the forward voltage is increased. Therefore, the film thickness is preferably from 5 nm to 200 nm, and more preferably from 10 nm to 100 nm.

A composition of a material of the interposed layer 8 is preferably $Ga_xIn_{1-x}P$ ($0.6 \leq X < 1$). It is because that the emitted light is absorbed when X is smaller than 0.6.

A dopant to be doped to a material of the oxide layer side contact layer 19 contacting to the oxide layer 10 in the reflective metal film side contact layer 9 is preferably Zn. The reason therefor is as follows. Since Zn can be doped more easily compared with Mg, it is possible to realize a low resistance. The contact resistance can be lowered by increasing the doping amount, thereby reducing the forward voltage.

A dopant to be doped to a material of the interposed layer side contact layer 17 contacting to the interposed layer 8 in the reflective metal film side contact layer 9 is preferably Mg. The reason therefor is as follows. Since Mg is hard to be dispersed compared with Zn, deterioration in the initial light output due to the dispersion can be suppressed, and the reliability (relative output) can be improved since it is hard to be dispersed. Herein, the reliability (relative output) is a ratio of the light output after electrification to the initial light output.

The intermediate contact layer 18 to be provided between the interposed layer side contact layer 17 of the reflective metal film side contact layer 9 and the oxide layer side contact layer 19 preferably comprises an undoped material, namely a material which is not positively doped. The reason therefor is as follows. When the Mg-doped layer and the Zn-doped layer are adjacent to each other, mutual dispersion occurs. The mutual dispersion can be prevented by interposing the intermediate contact layer 18.

The active layer 6 may comprise a MQW structure, a strained MQW structure, or an undoped bulk layer (single layer).

It is preferable that the active layer 6 comprises 20 to 160 layers namely 10 to 80 pairs of the MQW structures. The reason therefor is as follows. When the number of pairs is too small, the overflow of electrons or holes occurs, thereby deteriorating internal quantum efficiency. On the other hand, when the number of pairs is too large, the deterioration in the light output due to the light absorption in the active layer 6 occurs. The number of pairs is preferably from 10 pairs to 80 pairs, and more preferably from 20 pairs to 60 pairs. In addition, when the active layer 6 comprises a single layer the film thickness is preferably from 20 nm to 200 nm for the similar reason.

When the active layer 6 comprises a strained MQW structure, it is preferable that a well layer comprise an undoped $Ga_{0.4}In_{0.6}P$ (a thickness of 4 nm), and a barrier layer comprises $(Al_{0.5}Ga_{0.5})_{0.5}InP$ (a thickness of 10 nm).

In the semiconductor light emitting device 1i in the tenth preferred embodiment, the second cladding layer side undoped layer 25 is interposed between the p-type second cladding layer 7 and the active layer 6. However, a first cladding layer side undoped layer (not shown) may be interposed between the n-type first cladding layer 5 and the active layer 6. In addition, the respective undoped layers may comprise a low carrier concentration layer.

In the preferred embodiments, a $SiO_2$ layer (oxide layer) 10 is provided between the reflective metal film 11 and the double hetero structure part 20. However, the present invention is effective in a semiconductor light emitting device in which the oxide layer 10 is not provided.

The semiconductor light emitting devices 1g, 1h and 1i are for example red LED devices, each having a light emitting wavelength 630 nm. The present invention is still effective, in other LED devices using a material mainly comprising AlGaInP (with a light emitting wavelength from 560 nm to 660 nm) without modifying the material of each layer, the carrier concentration, the light extract layers 4, 4a or the like.

A surface-viewed shape of the first electrode 2 may be circular, rectangular, lozenge, polygonal or heteromorphous.

The material of the supporting substrate may comprise Si, GaAs, Ge, Cu, Mo, W, CuW or the like.

EXAMPLES

Example 1

An epitaxial wafer for an LED namely for a red LED having a light emitting wavelength of around 630 nm, having a structure shown in FIG. 1 was manufactured. The detailed manufacturing process such as epitaxial growth process, film thickness of each epitaxial layer, structure and material of each epitaxial layer, structure of a reflective metal film, structure and dimensions of an ohmic contact portion, method of re-sticking to the supporting substrate, method of forming electrodes, method of etching is as follows.

Figure 10:
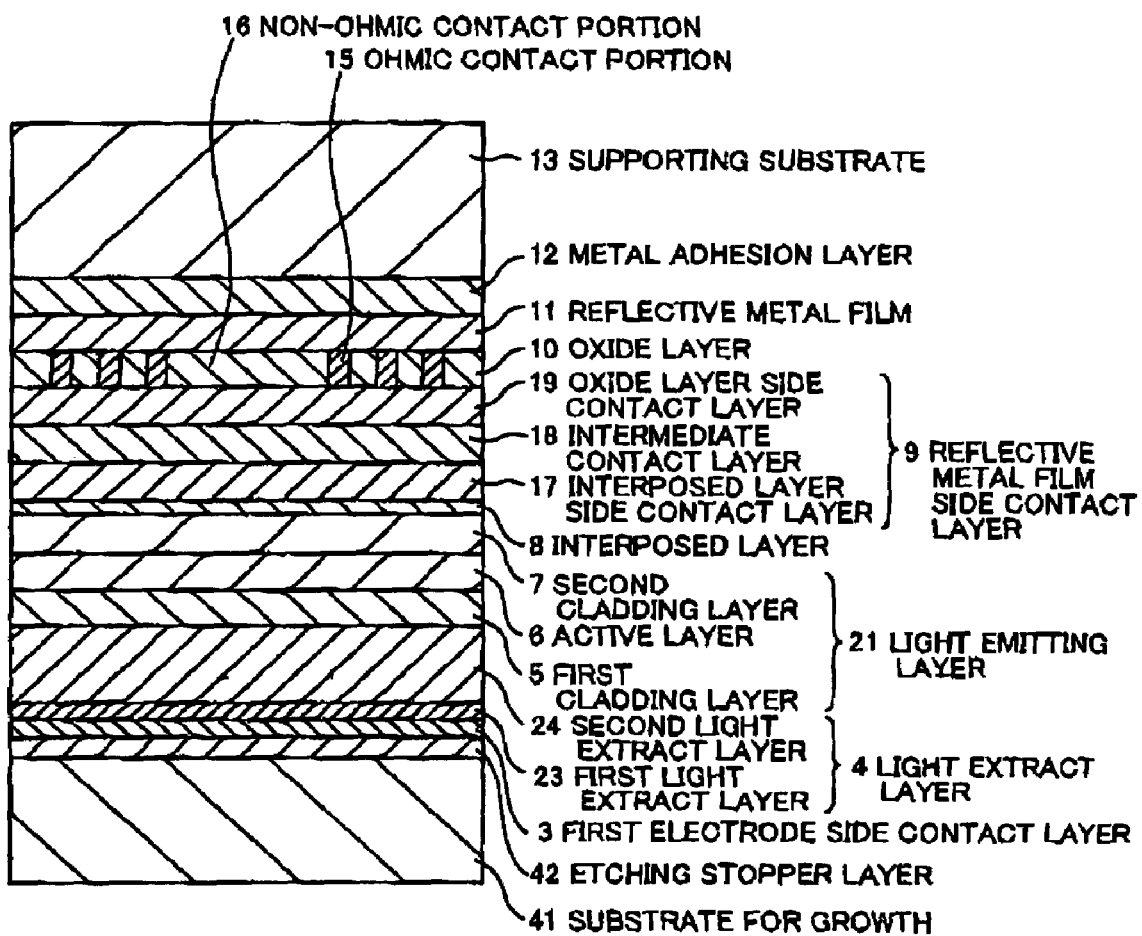
FIG. 10 is a schematic cross sectional view showing a structure of an epitaxial wafer grown during fabrication of the semiconductor light emitting device.

As shown in FIG. 10, on an n-type GaAs substrate (substrate for growth) 41, an n-type (Se-doped) $(Al_{0.7}Ga_{0.3})_{0.5}In_{0.5}P$ etching stopper layer (a film thickness of 200 nm and a carrier concentration of $1\times10^{18}/cm^3$) (etching stopper layer) 42, an n-type (Se-doped) GaAs contact layer (a film thickness of 50 nm and a carrier concentration of $1\times10^{18}/cm^3$) (first electrode side contact layer) 3, an n-type (Se-doped) $(Al_{0.7}Ga_{0.3})_{0.5}In_{0.5}P$ window layer (a film thickness of 500 nm and a carrier concentration of $1\times10^{18}/cm^3$) (first light extract layer) 23, an n-type (Se-doped) $(Al_{0.4}Ga_{0.6})_{0.5}In_{0.5}P$ window layer (a film thickness of 1000 nm and a carrier concentration of $1\times10^{18}/cm^3$) (second light extract layer) 24, an n-type (Se-doped) $(Al_{0.7}Ga_{0.3})_{0.5}In_{0.5}P$ cladding layer (a film thickness of 500 nm and a carrier concentration of $5\times10^{17}/cm^3$) (first cladding layer) 5, undoped MQW active layer (20 pairs of well layer of undoped $Ga_{0.5}In_{0.5}P$ (a film thickness of 5 nm)/barrier layer of $(Al_{0.5}Ga_{0.3})_{0.5}In_{0.5}P$ (a film thickness of 10 nm) (active layer) 6, a p-type (Mg-doped) $(Al_{0.7}Ga_{0.3})_{0.5}In_{0.5}P$ cladding layer (a film thickness of 400 nm and a carrier concentration of $1.2\times10^{18}/cm^3$) (second cladding layer) 7, a p-type (Mg-doped) $Ga_xIn_{1-x}P$ ($0.6\leq X<1$) interposed layer (a film thickness of 10 nm and a carrier concentration of $5\times10^{18}/cm^3$) 8, a p-type (Mg-doped) GaP layer (a film thickness of 200 nm and a carrier concentration of $1\times10^{18}/cm^3$) (interposed layer side contact layer) 17, an undoped GaP layer (a film thickness of 100 nm) (intermediate contact layer) 18, a p-type (Zn-doped) GaP layer (a film thickness of 50 nm and a carrier concentration of $1\times10^{19}/cm^3$) (oxide layer side contact layer) 19 were sequentially grown by the MOVPE method to provide an epitaxial wafer for an LED. In the active layer 6, a GaInP layer and an AlGaInP layer constitutes one pair.

This epitaxial wafer for an LED is characterized by that the first light extract layer 23 and the second light extract layer 24 are provided as double light extract layers, and that the Al composition ratio of the first light extract layer 23 which is the outermost layer in the semiconductor light emitting device is greater than that of the second light extract layer 24 next to the outermost layer. In other words, the material of the first and second light extract layers 23, 24 constituting the light extract layer 4 is respectively expressed as $(Al_xGa_{1-x})_yIn_{1-y}P$ ($0.3\leq X\leq 1$, $0.4\leq Y\leq 0.6$), and the value of X is 0.7 in the material of the first light extract layer 23 and the value of X is 0.4 in the material of the second light extract layer 24.

In addition, the film thickness of first light extract layer 23 is 500 nm, and the film thickness of the second light extract layer 24 is 1000 nm. The film thickness of the light extract layer 4 is 1500 nm that is the same as that of a light extract layer 104 in the conventional device to be described below.

A growth temperature for the MOVPE method is 650° C., a growth pressure is 6666 Pa (50 Torr), a growth rate of each layer is from 0.3 nm/sec to 1.0 nm/sec, and a V/III ratio is about 200. The V/III ratio is a proportion (quotient) in that a mol number of III group material such as TMGa, TMAl is a denominator, and a mol number of V group material such as $AsH_3$, $PH_3$ is a numerator.

As a source for the MOVPE method, an organic metal such as trimethylgallium (TMGa), triethylgallium (TEGa), trimethylaluminum (TMAl), trimethylindium (TMIn), or the like, and a hydride gas such as arsine ($AsH_3$), phosphine ($PH_3$) or the like were used.

As a dopant source for a conductivity type determination impurity (dopant) of the n-type semiconductor layer, hydrogen selenide ($H_2Se$) is used. As the dopant source for a conductivity type determination dopant of the p-type semiconductor layer, bis(cyclopentadienyl)magnesium ($Cp_2Mg$), or dimethylzinc (DMZn) is used.

In addition, as the dopant source for the conductivity type determination dopant of the n-type semiconductor layer, disilane ($Si_2H_6$), monosilane ($SiH_4$), diethyl tellurium (DETe), or dimethyl tellurium (DMTe) may be used. As the dopant source for the conductivity type determination dopant of the p-type semiconductor layer, diethyl zinc (DEZn) may be used.

After extracting the epitaxial wafer for an LED from the MOVPE apparatus, a $SiO_2$ layer (oxide layer) 10 having a film thickness of about 100 nm was formed on a surface of the oxide layer side contact layer 19, and the etching process was further conducted by using a general photolithography technique to form oxide removal holes 30 each having a surface-viewed diameter of about 12 μm with a pitch of 30 μm at the oxide layer 10, and an ohmic contact portion 15 was formed in the oxide removal hole 30 by vacuum deposition method to have a film thickness substantially equal to that of the oxide layer 10. As a material of the ohmic contact portion 15, a gold-zinc (AuZn) alloy was used. A surface-viewed diameter of the ohmic contact portion 15 was about 12 μm. This is called as a dot-shaped electrode. This ohmic contact portion 15 was formed to have a thickness of 100 nm with a surface-viewed pitch of 30 μm. In other words, the ohmic contact portion 15 was formed in the oxide removal hole by the vacuum deposition method to have the film thickness substantially equal to that of the oxide layer 10.

Thereafter, by alloying process of conducting a heat treatment on the epitaxial wafer for an LED at a temperature of 350° C. in an atmosphere of nitrogen gas for 5 minutes, the alloying of the reflective metal film side contact layer 9 and the ohmic contact portion 15 was completed.

As the reflective metal film 11, aluminum (Al), titanium (Ti), and gold (Au) were deposited in this order to have a film thickness of 200 nm, 200 nm, and 500 nm, respectively (total thickness is 900 nm), on the oxide layer 10 of the epitaxial wafer for an LED provided with the ohmic contact portion 15 (including a top of the ohmic contact portion 15).

As the metal adhesion layer 12, gold/germanium (AuGe) alloy, titanium (Ti), and gold (Au) were deposited in this order to have a film thickness of 100 nm, 200 nm, and 500 nm, respectively (total thickness is 800 nm), on a Si substrate prepared as the supporting substrate 13.

The epitaxial wafer for an LED on which the reflective metal film 11 is provided and the supporting substrate 13 on which the metal adhesion layer 12 is provided are stuck to each other such that the reflective metal film 11 and the metal adhesion layer 12 are affixed to each other. The sticking process was conducted by holding the epitaxial wafer for an LED and the supporting substrate 13 at a temperature of 350° C. in the state of a load of 3 MPa (30 kgf/cm$^2$) in an atmosphere of a pressure of 1.3 Pa (0.01 Torr) for 30 minutes.

By soaking the epitaxial wafer for an LED stuck to the supporting substrate 13 into ammonia water and hydrogen peroxide water based mixed liquid, the substrate 41 for growth was removed by the etching to expose the etching stopper layer 42. Thereafter, the etching stopper layer 42 was removed by using a hydrochloric acid based etching liquid to expose the first electrode side contact layer 3.

A pattern was formed on a surface of this first electrode side contact layer 3 by using the general photolithography technique, and a first electrode 2 comprising a circular portion with a surface-viewed diameter of 100 μm and distributed electrodes extending radially in a branch shape with a width of 10 μm from the circular portion was formed by the vacuum deposition. As the first electrode 2, gold/germanium (AuGe) alloy, nickel (Ni), and gold (Au) were deposited in this order to have a film thickness of 100 nm, 100 nm, and 500 nm, respectively (total thickness is 700 nm).

The first electrode side contact layer 3 except a portion just beneath the first electrode 2 was removed by selective etching with using the first electrode 2 as a mask and an etching liquid comprising a mixed liquid of sulfuric acid, hydrogen peroxide water and water, to expose the first light extract layer 23 of the light extract layer 4.

A surface of this light extract layer 4 was made as a rough surface by hydrochloric acid based etching. In this Example 1, the etching conditions of the first light extract layer 23 and the second light extract layer 24 are firstly found, then the etching composition and the etching time are adjusted based on these conditions, such that only the first light extract layer 23 is provided with a rough surface and the second light extract layer 24 is not provided with a rough surface.

Subsequently, the second electrode 14 was formed by the vacuum deposition on an entire surface of an outer side of the supporting substrate 13. In more concrete, aluminum (Al), titanium (Ti), and gold (Au) were deposited in this order. Thereafter, by an alloying process of conducting a heat treatment at a temperature of 400° C. in an atmosphere of nitrogen gas for 5 minutes, the second electrode 14 was alloyed.

The epitaxial wafer for an LED was cut by using a dicing apparatus, such that the circular portion of the first electrode 2 is located at a center of a chip, to provide an LED bare chip with dimensions of 300 μm×300 μm. The LED bare chip was mounted (die-bonding) on a TO-18 stem, and wire bonding is conducted for the LED bare chip, to provide an LED device.

The initial characteristics of the LED device in this Example were evaluated. As the initial characteristics, the light output was 6.68 mW and the forward voltage was 1.99V at a current flow of 20 mA (at the time of evaluation).

In the Example 1, a main surface S was made as a rough surface in the same manner as the conventional device to be described below. However, since the light extract layer 4 has a double layer structure, it is possible to prevent the film thickness of the light extract layer 4 from being totally reduced. The reason therefor is explained as follows. Since the etching rate of the second light extract layer 24 in the light extract layer 4 is lower than that of the first light extract layer 23, and the etching is stopped (significantly retarded) at the second light extract layer 24, thereby suppressing the reduction in the film thickness.

As described above, by preventing the reduction in the film thickness of the light extract layer 4, it is possible to suppress the elevation of the forward voltage, so that the forward voltage of 1.99 V can be achieved. In addition, the generation of the heat in the LED can be controlled by suppressing the elevation of the forward voltage, so that the light output can be improved. Further, a wide current spreading can be obtained, since the film thickness of the light extract layer 4 is not reduced, thereby providing a uniform current flown through the active layer 6. Accordingly, the generation of the heat in the LED can be further suppressed. Still further, since the current spreading property is improved, so that the deterioration of the light extract efficiency due to the shadow of the first electrode 15 can be suppressed. Accordingly, the light output was further increased. In addition, it is assumed that the overflow of carrier disappears by suppressing the current constriction, so that the internal quantum efficiency is improved. As the above factors improved by the Example 1 are overlapped, the light output is improved.

Comparative Example 1

Figure 11:
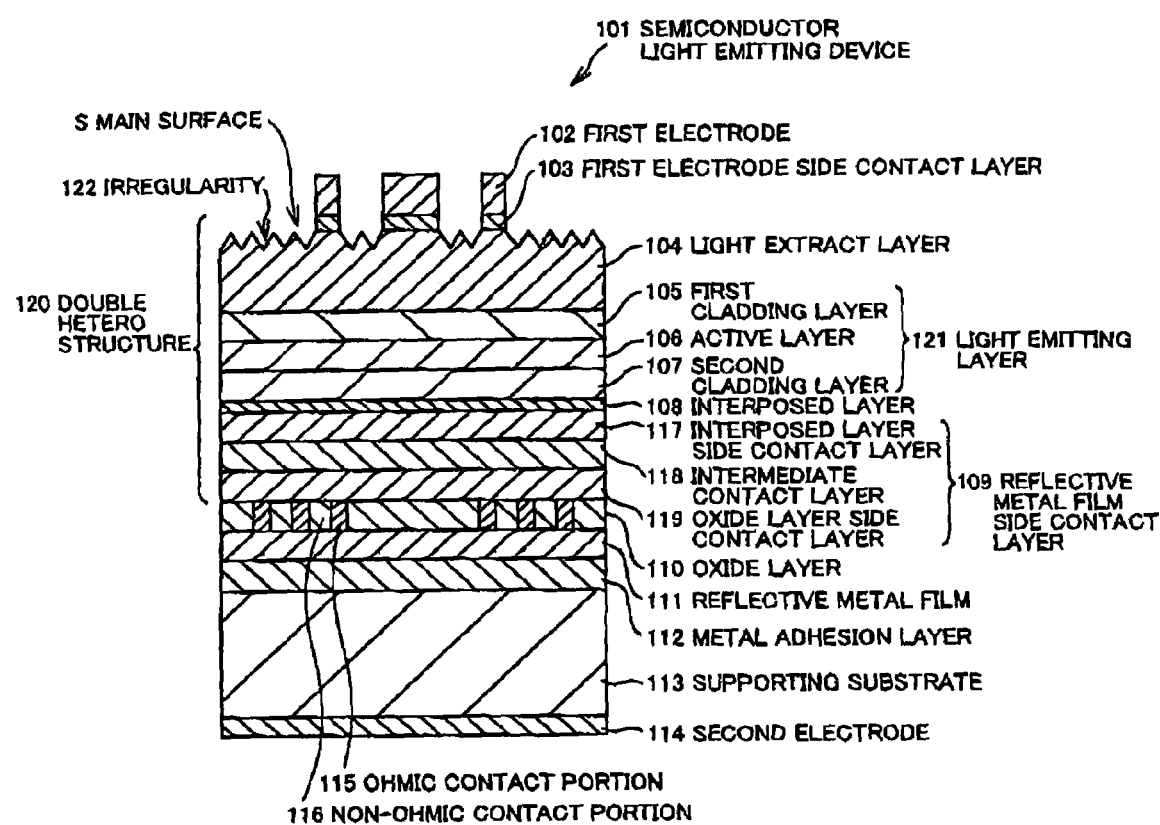
FIG. 11 is a schematic cross sectional view showing a structure of a conventional semiconductor light emitting device.

Conventional epitaxial wafers for an LED namely for a red LED having a light emitting wavelength of around 630 nm, in which the rough-surface treatment is conducted and the rough-surface treatment is not conducted, each having a structure shown in FIG. 11, were manufactured. The detailed manufacturing process such as epitaxial growth process, film thickness of each epitaxial layer, structure and material of each epitaxial layer, structure of a reflective metal film, structure and dimensions of an ohmic contact portion, method of re-sticking to the supporting substrate, method of forming electrodes, method of etching is in principle similar to that in the Example 1. Next, only the points different from the Example 1 will be explained in more detail.

A light extract layer 104 is consisted of a single layer of an n-type (Se-doped) $(Al_{0.4}Ga_{0.6})_{0.5}In_{0.5}P$ window layer (a film thickness of 1500 nm and a carrier concentration of $1\times10^{18}/cm^3$)

The initial characteristics of the LED device in the comparative example in which the rough-surface treatment was conducted were evaluated. As the initial characteristics, the light output was 5.1 mW and the forward voltage was 2.3 V at a current flow of 20 mA (at the time of evaluation).

The initial characteristics of the LED device in the comparative example in which the rough-surface treatment was not conducted were evaluated. As the initial characteristics, the light output was 4.4 mW and the forward voltage was 1.96 V at a current flow of 20 mA (at the time of evaluation).

As described above, by comparing the initial characteristics of the LED devices in the Example 1 and the comparative example 1 (conventional LED devices), it was confirmed that the enhancement of the light output and the reduction in the forward voltage can be achieved as a result of applying the present invention.

Example 2

An epitaxial wafer for an LED namely for a red LED having a light emitting wavelength of around 630 nm, having a structure shown in FIG. 8 was manufactured. The detailed manufacturing process such as epitaxial growth process, film thickness of each epitaxial layer, structure and material of each epitaxial layer, structure of a reflective metal film, structure and dimensions of an ohmic contact portion, method of re-sticking to the supporting substrate, method of forming electrodes, method of etching is as follows.

As shown in FIG. 10, on an n-type GaAs substrate (substrate for growth) 41, an n-type (Se-doped) $(Al_{0.7}Ga_{0.3})_{0.5}In_{0.5}P$ etching stopper layer (a film thickness of 200 nm and a carrier concentration of $1\times10^{18}/cm^3$) (etching stopper layer) 42, an n-type (Se-doped) GaAs contact layer (a film thickness of 50 nm and a carrier concentration of $1\times10^{18}/cm^3$) (first electrode side contact layer) 3, an n-type (Se-doped) $(Al_{0.4}Ga_{0.6})_{0.5}In_{0.5}P$ window layer (a film thickness of 400 nm and a carrier concentration of $1\times10^{18}/cm^3$) (first light extract layer) 23, an n-type (Se-doped) $(Al_{0.7}Ga_{0.3})_{0.5}In_{0.5}P$ window layer (a film thickness of 2600 nm and a carrier concentration of $1\times10^{18}/cm^3$) (second light extract layer) 24, an n-type (Se-doped) $(Al_{0.7}Ga_{0.3})_{0.5}In_{0.5}P$ cladding layer (a film thickness of 500 nm and a carrier concentration of $5\times10^{17}/cm^3$) (first cladding layer) 5, undoped MQW active layer (20 pairs of well layer of undoped $Ga_{0.5}In_{0.5}P$ (a film thickness of 4 nm)/barrier layer of $(Al_{0.5}Ga_{0.5})_{0.5}In_{0.5}P$ (a film thickness of 10 nm) (active layer) 6, a p-type (Mg-doped) $(Al_{0.7}Ga_{0.3})_{0.5}In_{0.5}P$ cladding layer (a film thickness of 400 nm and a carrier concentration of $1.2\times10^{18}/cm^3$) (second cladding layer) 7, a p-type (Mg-doped) $Ga_XIn_{1-X}P$ ($0.6 \leq X < 1$) interposed layer (a film thickness of 10 nm and a carrier concentration of $5\times10^{18}/cm^3$) 8, a p-type (Mg-doped) GaP layer (a film thickness of 200 nm and a carrier concentration of $1\times10^{18}/cm^3$) (interposed layer side contact layer) 17, an undoped GaP layer (a film thickness of 100 nm) (intermediate contact layer) 18, a p-type (Zn-doped) GaP layer (a film thickness of 50 nm and a carrier concentration of $1\times10^{19}/cm^3$ (oxide layer side contact layer) 19 were sequentially grown by the MOVPE method to provide an epitaxial wafer for an LED. In the active layer 6, a GaInP layer and an AlGaInP layer constitutes one pair.

This epitaxial wafer for an LED is characterized by that the first light extract layer 23 and the second light extract layer 24 are provided as double light extract layers, and that the Al composition ratio of the first light extract layer 23 which is the outermost layer in the semiconductor light emitting device is smaller than that of the second light extract layer 24 next to the outermost layer. In other words, the material of the first and second light extract layers 23, 24 constituting the light extract layer 4 is respectively expressed as $(Al_XGa_{1-X})_YIn_{1-Y}P$ ($0.3 \leq X \leq 1$, $0.4 \leq Y \leq 0.6$), and the value of X is 0.4 in the material of the first light extract layer 23 and the value of X is 0.7 in the material of the second light extract layer 24.

In addition, the film thickness of first light extract layer 23 is 400 nm, and the film thickness of the second light extract layer 24 is 2600 nm. The film thickness of the light extract layer 4 is 3000 nm that is the same as that of the light extract layer 104 in the conventional device to be described below.

A growth temperature, a growth pressure, a growth rate, and a V/III ratio are similar to those in Example 1.

A source for the MOVPE method, and dopant sources for a conductivity type determination impurity (dopant) of the n-type semiconductor layer and the p-type semiconductor layer are also similar to those in Example 1.

Other fabricating process is also similar to that in Example 1.

In the Example 2, the etching condition for exposing a part of the second light extract layer 24 was firstly found then the etching was conducted for a time longer than this etching condition, so that the irregularity 22 was formed from the first light extract layer 23 to the second light extract layer 24 as shown in FIG. 8, to provide a rough surface having an incli- nation of a surface of the irregularity 22 in the first light extract layer 23 smaller than that in the second light extract layer 24.

Subsequently, the second electrode 14 was formed by the vacuum deposition on an entire surface of an outer side of the supporting substrate 13. In more concrete, aluminum (Al), titanium (Ti), and gold (Au) were deposited in this order. Thereafter, by an alloying process of conducting a heat treatment at a temperature of 400° C. in an atmosphere of nitrogen gas for 5 minutes, the second electrode 14 was alloyed.

The epitaxial wafer for an LED was cut by using a dicing apparatus, such that the circular portion of the first electrode 2 is located at a center of a chip, to provide an LED bare chip with dimensions of 300 μm×300 μm. The LED bare chip was mounted (die-bonding) on a TO-18 stem, and wire bonding is conducted for the LED bare chip, to provide an LED device.

The initial characteristics of the LED device in the Example 2 were evaluated. As the initial characteristics, the light output was 6.64 mW and the forward voltage was 1.98V at a current flow of 20 mA (at the time of evaluation).

In the Example 2, a main surface S was made as a rough surface in the same manner as the conventional device to be described below. However, since the light extract layer 4 has a double layer structure, it is possible to prevent the film thickness of the light extract layer 4 from being totally reduced. The reason therefor is explained as follows. When the first light extract layer 23 was etched to expose a part of the second light extract layer 24, the etching of the second light extract layer 24 was started. Herein, the etching rate of the second light extract layer 24 is greater than that of the first light extract layer 23, so that the irregularity 22 having a desired level difference can be formed even though the etching rate is shortened, thereby suppressing the reduction in the film thickness of the light extract layer 4.

As described above, by preventing the reduction in the film thickness of the light extract layer 4, it is possible to suppress the elevation of the forward voltage, so that the forward voltage of 1.98V can be achieved. In addition, the generation of the heat in the LED can be controlled by suppressing the elevation of the forward voltage, so that the light output can be improved. Further, a wide current spreading can be obtained, since the film thickness of the light extract layer 4 is not reduced, thereby providing a uniform current flown through the active layer 6. Accordingly, the generation of the heat in the LED can be further suppressed. Still further, since the current spreading property is improved, so that the deterioration of the light extract efficiency due to the shadow of the first electrode 15 can be suppressed. Accordingly, the light output was further increased. In addition, it is assumed that the overflow of carrier disappears by suppressing the current constriction, so that the internal quantum efficiency is improved. As the above factors improved by the Example 1 are overlapped, the light output is improved.

Example 3

An epitaxial wafer for an LED namely for a red LED having a light emitting wavelength of around 630 nm, having a structure shown in FIG. 9A was manufactured. The detailed manufacturing process such as epitaxial growth process, film thickness of each epitaxial layer, structure and material of each epitaxial layer, structure of a reflective metal film, structure and dimensions of an ohmic contact portion, method of re-sticking to the supporting substrate, method of forming electrodes, method of etching is in principle similar to that in the Example 2. Next, only the points different from the Example 2 will be explained in more detail.

The light extract layer 4a comprises a first light extract layer 23b, a second light extract layer 24b and a third light extract layer 27. The first light extract layer 23b comprises an n-type (Se-doped) $(Al_{0.4}Ga_{0.6})_{0.5}In_{0.5}P$ window layer (a film thickness of 400 nm and a carrier concentration of $1\times10^{18}/cm^3$), the second light extract layer 24b comprises an n-type (Se-doped) $(Al_{0.7}Ga_{0.3})_{0.5}In_{0.5}P$ window layer (a film thickness of 100 nm and a carrier concentration of $1\times10^{18}/cm^3$), and the third light extract layer 27 comprises an n-type (Se-doped) $(Al_{0.4}Ga_{0.6})_{0.5}In_{0.5}P$ window layer (a film thickness of 2500 nm and a carrier concentration of $1\times10^{18}/cm^3$).

In the Example 2, this epitaxial wafer for an LED is characterized by that the first light extract layer 23b, the second light extract layer 24b and the third light extract layer 27 are provided as triple light extract layers, and that the Al composition ratio of the first light extract layer 23b which is the outermost layer of the light extract layer 4 in the semiconductor light emitting device is equal to that of the third light extract layer 27 which is the innermost layer of the light extract layer 4 in the semiconductor light emitting device, and the Al composition ratio of the second light extract layer 24b interposed therebetween is greater than those of the first light extract layer 23b and the third light extract layer 27. In other words, the material of the first, second and third light extract layers 23b, 24b, and 27 constituting the light extract layer 4 is respectively expressed as $(Al_XGa_{1-X})_YIn_{1-Y}P$ ($0.3 \leq X \leq 1$, $0.4 \leq Y \leq 0.6$), and the value of X is 0.4 in the material of the first and third light extract layers 23b, 27 and the value of X is 0.7 in the material of the second light extract layer 24b.

In addition, a distance from a surface of the light extract layer 4a (from the first electrode side contact layer 3) to a surface of the second light extract layer 24b is 400 nm.

Compared with the conventional device to be explained below, the configuration of the Example 3 corresponds to a configuration in that an insertion layer comprising a material having the Al composition ratio greater than that of the light extract layer 104 is inserted into the light extract layer 104.

The initial characteristics of the LED device in the Example 2 were evaluated. As the initial characteristics, the light output was 6.72 mW and the forward voltage was 1.99V at a current flow of 20 mA (at the time of evaluation).

Comparative Example 2

Conventional epitaxial wafers for an LED namely for a red LED having a light emitting wavelength of around 630 nm, in which the rough-surface treatment is conducted and the rough-surface treatment is not conducted, each having a structure shown in FIG. 11, were manufactured. The detailed manufacturing process such as epitaxial growth process, film thickness of each epitaxial layer, structure and material of each epitaxial layer, structure of a reflective metal film, structure and dimensions of an ohmic contact portion, method of re-sticking to the supporting substrate, method of forming electrodes, method of etching is in principle similar to that in the Example 2. Next, only the points different from the Example 2 will be explained in more detail.

A light extract layer 104 is consisted of a single layer of an n-type (Se-doped) $(Al_{0.4}Ga_{0.6})_{0.5}In_{0.5}P$ window layer (a film thickness of 3000 nm and a carrier concentration of $1\times10^{18}/cm^3$)

The initial characteristics of the LED device in the comparative example in which the rough-surface treatment was conducted were evaluated. As the initial characteristics, the light output was 5.0 mW and the forward voltage was 2.3 V at a current flow of 20 mA (at the time of evaluation).

The initial characteristics of the LED device in the comparative example in which the rough-surface treatment was not conducted were evaluated. As the initial characteristics, the light output was 4.3 mW and the forward voltage was 1.96 V at a current flow of 20 mA (at the time of evaluation).

As described above, by comparing the initial characteristics of the LED devices in the Examples 2, 3, and comparative example 2 (conventional LED devices), it was confirmed that the enhancement of the light output and the reduction in the forward voltage can be achieved as a result of applying the present invention.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting device, comprising:
    a plurality of semiconductor layers including:
        a first cladding layer;
        a second cladding layer;
        an active layer for generating a light, provided between the first cladding layer and the second cladding layer; and
        a light extract layer constituting a main surface at a side of the first cladding layer;
    a first electrode for partially covering the light extract layer;
    a second electrode for covering a surface opposite to the main surface;
    a reflective metal film for reflecting a light provided between the second cladding layer and the second electrode;
    an oxide layer adjacent to an active layer side of the reflective metal film; and
    an ohmic contact portion in a part of the oxide layer,
    wherein the light extract layer comprises a plurality of layers having different composition ratios,
    an irregularity is formed penetrating a plurality of the layers to rough the main surface,
    the irregularity comprises irregular surfaces on a side face of a plurality of the layers and different in inclination between two adjacent layers of a plurality of the layers, and
    a total film thickness of the light extract layer on the first cladding layer is from 1000 nm to 3000 nm.

2. The semiconductor light emitting device according to claim 1, wherein an inclination of an irregular surface of a first layer of a plurality of the layers is greater than that of a second layer adjacent to the first layer of a plurality of layers.

3. The semiconductor light emitting device according to claim 2, wherein an Al composition ratio of the first layer is greater than that of the second layer.

4. The semiconductor light emitting device according to claim 2, wherein a bandgap energy of the first layer is greater than that of the second layer.

5. The semiconductor light emitting device according to claim 1, wherein a material of each of the layers constituting the light extract layer is expressed as $(Al_{X1}Ga_{1-X1})_{Y1}In_{1-Y1}P$ ($0.3 \leq X1 \leq 1$, $0.4 \leq Y1 \leq 0.6$).

6. The semiconductor light emitting device according to claim 2, wherein a refractive index of the first layer is greater than that of the second layer.

7. The semiconductor light emitting device according to claim 1, further comprising:

a first electrode side contact layer covering a part covered by the first electrode, provided between the light extract layer and the first electrode, having a bandgap energy smaller than that of the active layer, and being opaque with respect to the light emitted from the active layer.

8. The semiconductor light emitting device according to claim 2, wherein a film thickness of the first layer is from 30 nm to 1000 nm.

9. The semiconductor light emitting device according to claim 1, further comprising:
a reflective metal film side contact layer provided between the oxide layer and the second cladding layer, and mainly comprising a GaP.

10. The semiconductor light emitting device according to claim 9, further comprising:
an interposed layer provided between the reflective metal film side contact layer and the second cladding layer, and comprising $Ga_{X2}In_{1-X2}P$ ($0.6 \leqq X2 \leqq 1$).

11. The semiconductor light emitting device according to claim 9, wherein the reflective metal film side contact layer comprises first, second and third layers, the first layer adjacent to the interposed layer is doped with Mg, the third layer adjacent to the oxide layer is doped with Zn, and the second layer provided between the first and third layers is not positively doped.

12. The semiconductor light emitting device according to claim 1,
wherein a film thickness $d_1$ of a non-ohmic contact portion in the oxide layer is within a range of ±30% of a standard film thickness dst that is expressed as:

$$dst = \alpha \times \lambda p / 4 \times n$$

(dst is the standard film thickness, $\alpha$ is a constant of an odd number, $\lambda p$ is a wavelength of the light emitted from the active layer, and n is a refractive index of the light emitted from the active layer in the non-ohmic contact portion), and
wherein a film thickness $d_2$ of an ohmic contact portion in the oxide layer is equal to the film thickness $d_1$.

13. The semiconductor light emitting device according to claim 2, further comprising:
an insertion layer inserted into the first cladding layer, the insertion layer comprising a material having a smaller Al composition ratio and a greater refractive index than those of a material of the first cladding layer,
wherein a film thickness of the first cladding layer is not less than 1000 nm, and the first cladding layer functions as a light extract layer.

14. The semiconductor light emitting device according to claim 1, wherein an inclination of an irregular surface of a first layer of a plurality of the layers is smaller than that of a second layer adjacent to the first layer of a plurality of the layers.

15. The semiconductor light emitting device according to claim 14, wherein an Al composition ratio of the first layer is smaller than that of the second layer.

16. The semiconductor light emitting device according to claim 14, wherein a bandgap energy of the first layer is smaller than that of the second layer.

17. The semiconductor light emitting device according to claim 14, wherein a total film thickness of the light extract layer and the first cladding layer is from 800 nm to 5500 nm.

18. The semiconductor light emitting device according to claim 14, wherein a refractive index of a material of the light extract layer is greater than that of the first cladding layer.

19. The semiconductor light emitting device according to claim 14, wherein a film thickness of the first layer is from 50 nm to 1000 nm, and a film thickness of the second layer is from 50 nm to 1000 nm.

* * * * *